(12) United States Patent
Hirota et al.

(10) Patent No.: US 8,508,020 B2
(45) Date of Patent: Aug. 13, 2013

(54) METHOD FOR MANUFACTURING SEMICONDUCTOR DEVICE

(71) Applicant: Elpida Memory, Inc., Tokyo (JP)

(72) Inventors: Toshiyuki Hirota, Tokyo (JP); Takakazu Kiyomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/712,126

(22) Filed: Dec. 12, 2012

(65) Prior Publication Data

US 2013/0119514 A1   May 16, 2013

Related U.S. Application Data

(63) Continuation of application No. 13/227,667, filed on Sep. 8, 2011, now Pat. No. 8,357,583.

(30) Foreign Application Priority Data

Sep. 10, 2010  (JP) ................. 2010-202853

(51) Int. Cl.
*H01L 21/02* (2006.01)
(52) U.S. Cl.
USPC ........... 257/532; 257/296; 257/301; 257/303; 257/310; 257/E29.343

(58) Field of Classification Search
USPC .................................. 257/532, 296
See application file for complete search history.

(56) References Cited

U.S. PATENT DOCUMENTS

| 2008/0029801 A1* | 2/2008 | Nakamura .................... 257/303 |
| 2009/0267132 A1 | 10/2009 | Cha et al. |
| 2011/0024875 A1 | 2/2011 | Takebayashi et al. |
| 2011/0102968 A1 | 5/2011 | Choi et al. |

FOREIGN PATENT DOCUMENTS

JP    2006-135339    5/2006

* cited by examiner

*Primary Examiner* — Angel Roman
(74) *Attorney, Agent, or Firm* — Young & Thompson

(57) ABSTRACT

A method for manufacturing a semiconductor device includes at least forming a lower electrode comprising titanium nitride on a semiconductor substrate, forming a dielectric film comprising zirconium oxide as a primary constituent on the lower electrode, forming a first protective film comprising a titanium compound on the dielectric film, and forming an upper electrode comprising titanium nitride on the first protective film. The method can include a step of forming a second protective film on the lower electrode before the step of forming the dielectric film on the lower electrode.

15 Claims, 14 Drawing Sheets

METHOD FOR MANUFACTURING SEMICONDUCTOR DEVICE

BACKGROUND OF THE INVENTION

1. Field of Invention

The present invention relates to a semiconductor device and a method of manufacturing the same, and, in particular, to dynamic random access memory (DRAM) having a capacitor with properties of low leakage current and high permittivity.

2. Description of Related Arts

DRAM has been used for a semiconductor memory operable at a high speed in a computer or other electronic devices. DRAM has a memory cell array and a peripheral circuit for operating the array. The memory cell array has a plurality of units arranged in a matrix, and each unit comprises one switching transistor and one capacitor.

As in other semiconductor devices, DRAM has developed with miniaturization of each cell to satisfy a demand for high-integration. As a result, the area on which a capacitor is formed decreases, and it is thus difficult to ensure the capacity required for a memory device. To solve this problem, a three-dimensional structure of electrodes, upper and lower electrodes made of a metallic material (MIM structure), a capacitive insulation film having high permittivity, etc have been introduced. Currently, DRAM with a minimum feature size (F value) of 70 nm or less, which is used as a standard index of a technology level, necessarily has a three-dimensional electrode structure, and upper and lower electrodes made of a metallic material have already been used in practice. Therefore, the prospect of improving the features of a capacitor on the basis of these technical developments is bleak. The current trend of additional miniaturization mainly includes improving the feature of a capacitor by high permittivity of a capacitive insulation film left for the last.

Recently, a capacitor with a MIM structure, e.g., a structure of $TiN/ZrO_2/TiN$, has been used as a DRAM capacitor.

DRAM is formed from heat treatment at 450° C. to 500° C. as an unavoidable process after a capacitor has been formed. However, a dielectric film made of a single body of zirconium oxide cannot achieve a sufficient thermostability, and leakage current likely increases after heat treatment.

Therefore, several attempts have been made to increase thermostability, and the examples of such attempts include a multilayer dielectric film, e.g., a ZAZ structure where Z and A mean $ZrO_2$ and $Al_2O_3$, respectively, in $ZrO_2/Al_2O_3/ZrO_2$, or a laminating layer having a plurality of $Al_2O_3$ and $ZrO_2$ layers alternately.

This structure aims to accomplish the desirable characteristic from the combination of zirconium oxide ($ZrO_2$) having high permittivity and aluminum oxide ($Al_2O_3$) having high thermostability instead of high permittivity.

For example, JP 2006-135339 A discloses an AZ, ZA, or ZAZ structure, or a method for forming a multilayer dielectric film alternately laminating a $ZrO_2$ thin film and an $Al_2O_3$ thin film.

In practical DRAM, a heat treatment with a process of forming an upper electrode, which is to be performed after forming a dielectric film of a capacitor, or a heat treatment such as hydrogen annealing for reducing the interface state of a transistor, is carried out. However, this heat treatment, which is performed after forming a dielectric film comprising zirconium oxide such as a ZAZ structure as a principal component, may cause leakage current of a capacitor. This result may impose restrictions on the manufacturing process, and make it difficult to achieve a good characteristic of transistors by a sufficient hydrogen annealing. As described herein, a dielectric film having zirconium oxide as a primary constituent means a dielectric film having a composite ratio of 0.8 or more, the composite ratio being indicated $Z/(Z+M)$ where Z is the number of zirconium atoms and M is the number of metallic atoms other than zirconium in the dielectric substance.

The inventors in this invention found out that the increase in leakage current in a capacitor, which has been caused with the heat treatment, may occur due to the combination of (1) the degradation of the dielectric film itself by the increase of oxygen deficit in a dielectric film or by the diffusion of impurities such as nitrogen, (2) the partial desquamation of a dielectric film, which has zirconium oxide as a primary constituent, from titanium nitride electrodes, and (3) damages, such as crack, on a dielectric film itself. These events are considered to stem from a change in stress caused particularly by the heat treatment under reducing atmosphere or by the secondary growth of crystal grains of a dielectric film.

SUMMARY

The inventors found that a capacitor having a dielectric film, whose primary constituent is zirconium oxide of, for example, a ZAZ structure may prevent the increase in leakage current in spite of a heat treatment during the formation of an upper electrode and a hydrogen annealing for decreasing the interface state of transistors, if the capacitor is formed by forming a dielectric film comprising zirconium oxide in a microcrystal state as a primary constituent, forming a first protective film having titanium oxide as a primary constituent under a condition devoid of the secondary growth of crystal grains, and then forming an upper electrode. As described herein, the secondary growth of crystal grains means the rearrangement of constituent atoms by, for example, a heat treatment after film formation, and the change into larger crystal grains by the reformation of grain boundary.

Additionally, a sufficient tolerance against an inevitable heat treatment in a DRAM manufacturing process has been found to be accomplished by further providing a second protective film between a lower electrode and a dielectric film comprising zirconium oxide as a primary constituent, the second protective film comprising titanium oxide as a primary constituent.

Specifically, one embodiment of the invention provides a method for manufacturing a semiconductor device including a formation of a capacitor, wherein the formation of the capacitor comprises at least:

forming a lower electrode comprising titanium nitride on a semiconductor substrate, forming a dielectric film comprising zirconium oxide as a primary constituent on said lower electrode, forming a first protective film comprising a titanium compound as a primary constituent on said dielectric film, and forming an upper electrode comprising titanium nitride on said first protective film.

Further, another embodiment of the invention provides a method for manufacturing a semiconductor device including a formation of a capacitor, wherein the formation of the capacitor comprises at least:

forming a lower electrode comprising titanium nitride on a semiconductor substrate, forming a second protective film on said lower electrode, forming a dielectric film comprising zirconium oxide as a primary constituent on said second protective film, forming a first protective film comprising a titanium compound on said dielectric film, and forming an upper electrode comprising a titanium nitride on said first protective film.

According to the invention, the structure of a protective film inserted into the interface between the titanium nitride electrode and the dielectric film comprising zirconium oxide as a primary constituent can prohibit damages to the dielectric film caused by heat treatment during the formation of the upper electrode or by annealing for decreasing the interface state of transistors. As a result, restrictions, such as an upper limit in process temperature, imposed on a manufacturing process can be alleviated, and the characteristic of transistors can thus be compatible with that of capacitors. Accordingly, high reliability and a high yield rate can be accomplished for a device.

BRIEF DESCRIPTION OF DRAWINGS

The above features and advantages of the present invention will be more apparent from the following description of certain preferred embodiments taken in conjunction with the accompanying drawings, in which.

DETAILED DESCRIPTION OF REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

EXPERIMENT 1

First, a capacitor having a single layer of a $ZrO_2$ film (hereinafter referred to as "ZrO film") has been evaluated.

Figure 1:
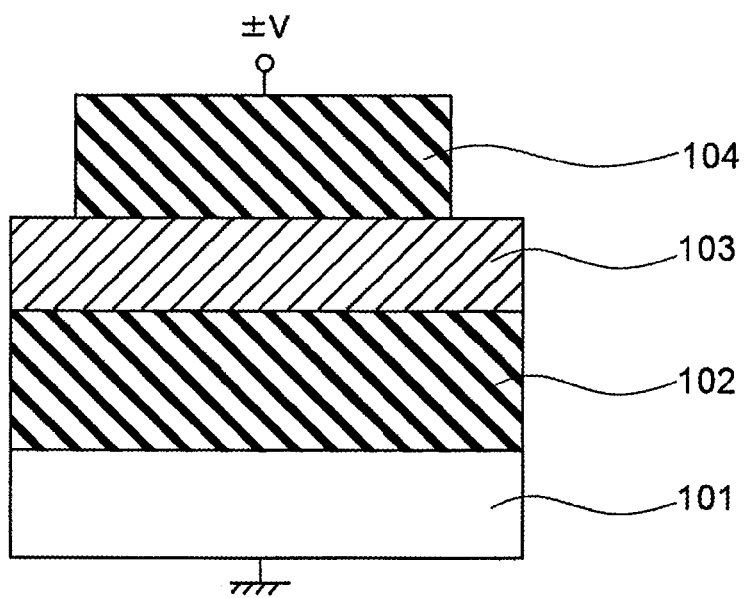
FIG. 1 is a schematic, cross-sectional view of a capacitor structure in the related art, showing a structure of a single layer ZrO film.

FIG. 1 shows the structure of a flat capacitor including lower electrode 102 made of a titanium nitride film (TiN film), upper electrode 104 made of a TiN film in the same way, and dielectric film 103 made of a ZrO film sandwiched between the upper and lower electrodes.

Lower electrode 102 made of a TiN film has been formed using a chemical vapor deposition (CVD) method with reaction gases of titanium tetrachloride ($TiCl_4$) and ammonia ($NH_3$) in consideration of the application thereof to a three-dimensional structure. The deposition temperature was 450° C., and the thickness of the film was 10 nm. Hereinafter, a TiN film formed by a CVD method is referred to as a CVD-TiN film.

The ZrO film, which is to be dielectric film 103, has been formed using an atomic layer deposition (ALD) method with a reaction gas of ozone ($O_3$) and a Zr precursor of TEMAZ, i.e., tetrakis(ethylmethylamino) zirconium: $Zr[N(CH_3) CH_2CH_3]_4$, which is an organometallic complex. The temperature of forming the film was 250° C. and the film thickness was 6 nm. Dielectric film 103 is formed by repeating a fundamental sequence until a desired film thickness is obtained, the sequence including the steps of introducing the Zr precursor into a reaction chamber in which a semiconductor substrate is installed and adsorbing the Zr precursor on the surface of the lower electrode as one atomic layer, nitrogen-purging the remaining precursor in a gas phase, introducing ozone and oxidizing the adsorbed precursor, and nitrogen-purging the remaining ozone in a gas phase.

Upper electrode 104 made of a TiN film has been formed using a mask sputtering method with a known area. The mask sputtering method is to set a flat mask on the top surface of the ZrO film, to deposit a TiN film (hereinafter referred to as "PVD-TiN film") thereon by a sputtering method, and to form an upper electrode in dot shape. The depositing temperature was room temperature, and the film thickness was 10 nm.

Figure 2:
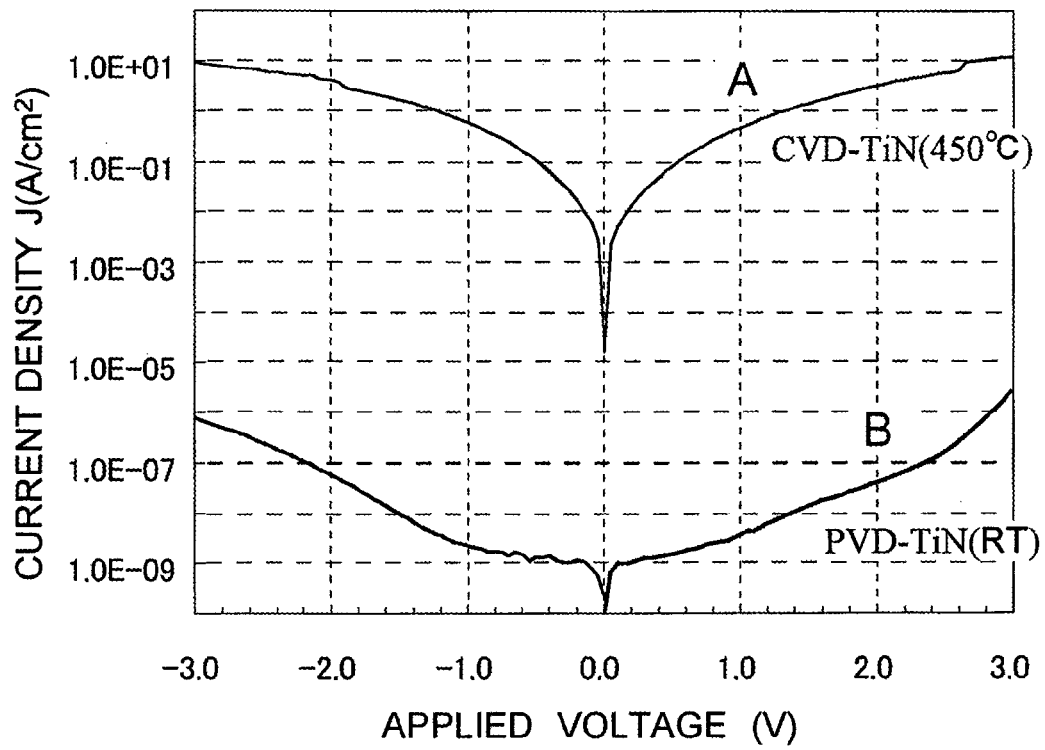
FIG. 2 is a graph illustrating the characteristic of leakage current in the capacitor of FIG. 1.

The curve indicated as Reference B in FIG. 2 illustrates the characteristic of leakage current when a voltage between −3 V and +3 V is applied to upper electrode 104 in the capacitor structure explained above. It is notified that +2.3 V and −2.2 V became the voltages applied to meet the index of current density, i.e., 1 E-7 ($A/cm^2$). The above capacitor shows the leakage current characteristic having a sufficient margin in that the leakage current standard, which is allowable for use as a semiconductor device, is equal to 1 V or more in both positive and negative values at the current density level.

The curve indicated as Reference A in FIG. 2 shows a result where the upper electrode uses a CVD-TiN film as does the lower electrode instead of a PVD-TiN film. As clearly depicted in the figure, the leakage current increases by seven exponents under the structure with the upper electrode made of a CVD-TiN film compared to the structure with the upper electrode made of a PVD-TiN film. The capacitor in this case makes it difficult to store information therein, and cannot be in use.

For application to a three-dimensional capacitor, as stated above, the upper electrode, as well as the lower electrode, should be formed by a CVD method, which ensures good step coverage. However, the characteristic indicated by Reference A has a substantially large amount of leakage current, thereby failing to make a semiconductor device in use.

The inventors here have examined the difference in the methods of the upper electrode, i.e., several conditions in sputtering and CVD methods, to find what condition influences the leakage current in the ZrO film, which forms a dielectric film, to change severely. As a result, the primary causes of severely changing leakage current are assumed as the temperature of forming a film and the environment therearound. That is, the sputtering method establishes the environment of inert gases including argon (Ar) at room temperature in the sputter method, while the CVD method establishes the environment of titanium tetrachloride gas ($TiCl_4$) and ammonia gas ($NH_3$) and hydrogen chloride gas (HCl) or hydrogen gas ($H_2$) which are generated by reaction of titanium tetrachloride gas ($TiCl_4$), ammonia gas ($NH_3$). These environments were thought to be the primary cause.

In other words, it was found that the leak characteristic of a capacitor having a dielectric film made of a crystallized zirconium oxide film depends largely on the method of forming the upper electrode.

The CVD-TiN film as the upper electrode is assumed to impose certain damage on the ZrO film of the dielectric film in a film forming process.

When forming a film, a CVD-TiN is different from a PVD-TiN in that it is exposed to titanium tetrachloride ($TiCl_4$) and ammonia ($NH_3$), or gases generated by reaction thereof, at a temperature of 380° C. to 650° C. Therefore, this difference in film forming conditions is thought to influence on the characteristic.

However, the PVD-TiN cannot be applied to a capacitor in a three-dimensional structure having a high aspect ratio, which is currently used for DRAM, because of inferior step coverage of the PVD-TiN.

EXPERIMENT 2

A capacitor with a ZAZ structure has been evaluated. The ZAZ structure is one of the dielectric film structures having zirconium oxide as a primary constituent, and one of the dielectric film structure within which aluminum oxide is included. A capacitor using a dielectric film of a ZAZ structure is referred to as a capacitor with a ZAZ structure.

Figure 3:
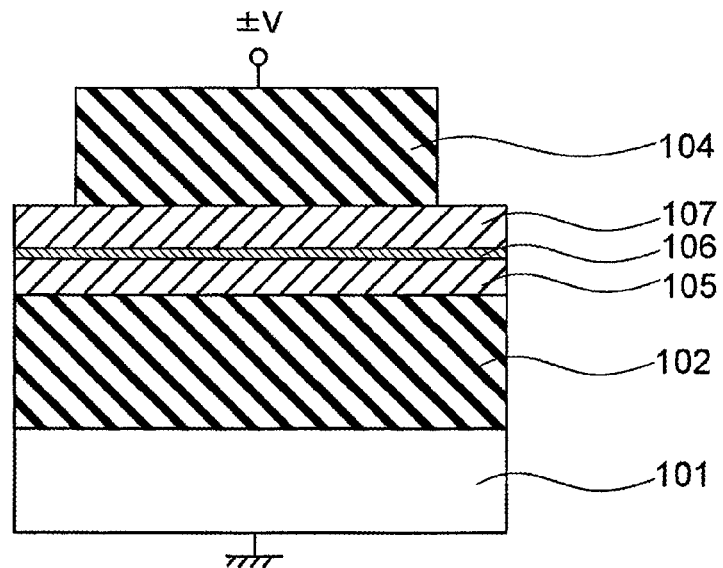
FIG. 3 is a schematic, cross-sectional view of a capacitor structure in the related art, showing a ZAZ structure.

FIG. 3 illustrates a flat capacitor including lower electrode 102 made of a CVD-TiN film, upper electrode 104 identically made of a CVD-TiN film, first dielectric film 105 made of a ZrO film formed on lower electrode 102, second dielectric film 106 made of an aluminum oxide film (hereinafter referred to as "AlO film") formed on first dielectric film 105, and third dielectric film 107 made of a ZrO film formed on second dielectric film 106.

Lower electrode 102 made of a CVD-TiN film has been formed using a CVD method with reaction gases of titanium tetrachloride ($TiCl_4$) and ammonia ($NH_3$) in consideration of the application thereof to a three-dimensional structure. The deposition temperature was 450° C., and the thickness of the film was 10 nm.

The ZrO film, which is to be first dielectric film 105, has been formed using an atomic layer deposition (ALD) method with a reaction gas of ozone ($O_3$) and a Zr precursor of TEMAZ, i.e., tetrakis(ethylmethylamino) zirconium: $Zr[N(CH_3)CH_2CH_3]_4$, which is a organometallic complex. The temperature of forming the film was 250° C. and the film thickness was 3 nm. First dielectric film 105 is formed by repeating a fundamental sequence until a desired film thickness is obtained, the sequence comprising the steps of introducing the Zr precursor into a reaction chamber in which a semiconductor substrate is installed and adsorbing the Zr precursor on the surface of the lower electrode as an atomic layer, nitrogen-purging the remaining precursor in a gas phase, introducing ozone and oxidizing the adsorbed precursor, and nitrogen-purging the remaining ozone in a gas phase. The oxidizing agent may be a mixture gas of ozone ($O_3$) and oxygen ($O_2$), or water ($H_2O$).

The AlO film, which is to be second dielectric film 106, has been formed using an ALD method at 250° C. with an Al precursor of TMA (trimethyl aluminum). This sample performed five film forming processes (i.e., approximately 0.5 nm) in an ALD cycle. Second dielectric film 106 is formed by repeating a fundamental sequence until a desired film thickness is obtained, the sequence comprising the steps of introducing the Al precursor into a reaction chamber in which a semiconductor substrate is installed and adsorbing the Al precursor on the surface of first dielectric film 105 as an atomic layer, nitrogen-purging the remaining precursor in a gas phase, introducing ozone and oxidizing the adsorbed precursor, and nitrogen-purging the remaining ozone in a gas phase. The oxidizing agent may be a mixture gas of ozone ($O_3$) and oxygen ($O_2$), or water ($H_2O$).

Then, a ZrO film of third dielectric film 107 was formed as is first dielectric film 105. The film thickness was 3 nm. First and third dielectric films 105 and 107 had a film thickness of 3 nm, respectively, in this experiment, but they are not necessarily to have the same film thickness. For example, first dielectric film 105 can have a film thickness of 5.0 nm while third dielectric film 107 can have a film thickness of 1.0 nm. As such, both films can have an asymmetrical structure.

As in lower electrode 102, upper electrode 104 made of a CVD-TiN film has been formed by a CVD method at 450° C. and to have a film thickness of 10 nm.

Figure 4:
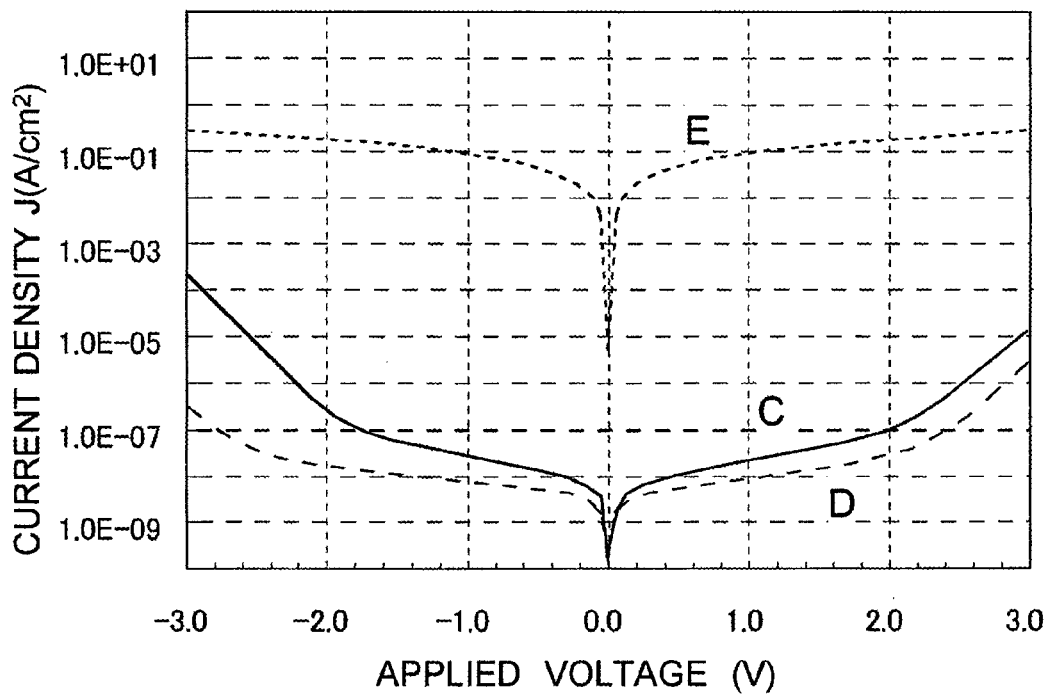
FIG. 4 is a graph illustrating the characteristic of leakage current in the capacitor of FIG. 3.

I-V characteristic of the capacitor formed as above was evaluated, and is illustrated in FIG. 4. In FIG. 4, Reference C shows the I-V characteristic of the capacitor measured after the upper electrode has been formed, Reference D shows the I-V characteristic of the capacitor measured after the upper electrode has been formed and then additionally annealed with nitrogen at 450° C. for six hours, and Reference E shows the I-V characteristic of the capacitor measured after the upper electrode has been formed, annealed with nitrogen at 450° C. for six hours and annealed with hydrogen at 450° C. for two hours.

With respect to Reference C, the applied voltage is −1.8 V or +2.0 V to meet the index current density of 1 E-7 (A/cm$^2$). It is understood that the characteristic improves compared to Reference B as well as Reference A depicted in FIG. 2.

Reference D shows a better leakage current characteristic in that the applied voltage is −2.8 V or +2.4 V to meet the index current density of 1 E-7 (A/cm$^2$). This characteristic is thought to result from a further densification of a dielectric film by heat treatment. However, Reference E illustrating the status after hydrogen annealing for two hours shows that the current density of 1 E-7 (A/cm$^2$) cannot be reached, and that a practical capacitor cannot be obtained.

Based on the results of Experiments 1 and 2, the significant deterioration in a leakage current characteristic after hydrogen annealing of a dielectric film having a ZAZ structure for two hours is thought to be caused by a probable damage by a CVD-TiN film on a ZrO film of the third dielectric film during a process of forming the upper electrode, just as about a single ZrO film depicted in Experiment 1.

A ZrO film formed by an ALD method is in a microcrystal state shortly after it has been formed at 250° C. When this ZrO film in a microcrystal state is heat treated at a higher temperature than the film forming temperature, a secondary growth of crystal grains occurs. The secondary growth of crystal grains depends on the thickness of a film, and, given the same condition for heat treatment, a thicker film leads a polycrystalline structure having a larger grain size.

In the meantime, the microcrystal state means a state where a clear grain boundary is not observed in an image from a transmission electron microscope while a small peak caused by a crystal is observed in X-ray diffraction (XRD).

The leakage current is assumed to deteriorate as depicted Reference A in FIG. 2 because the single layer of a ZrO film has relatively thick and changes into a polycrystalline structure having a larger grain size. In contrast, a ZAZ structure interposes an AlO film between ZrO films and thus constitutes relatively thin ZrO films without a polycrystalline structure having a large grain size. Furthermore, because an AlO film has a relatively high crystallization temperature and thus remains in an amorphous phase without crystallization at a temperature of a semiconductor process, an interfacial debonding or a crack by stress relaxation are assumed to be prevented. Accordingly, during annealing in an inert environment and after the formation of a CVD-TiN film as an upper electrode, the expansion of damage by the secondary growth in crystal grains of a ZrO film is thought to be prevented by the presence of an amorphous AlO film. However, annealing for a long time in a hydrogen gas environment loses the effect by the AlO film of preventing the expansion of damage and is thus thought to lead the deterioration of leakage current.

Therefore, in order to prevent the damage caused by the secondary growth in particle grains of a ZrO film, it was assumed to be desirable to cover the surface of the ZrO film with a protective film at a temperature at which the secondary growth of particle grains of the ZrO film decreases, preferably at a temperature at which the secondary growth of particle grains of the ZrO film does not substantially occur, and then to form a CVD-TiN film as an upper electrode.

Here, it was found that a titanium compound was effective as a protective film. In particular, a titanium oxide, which is an oxide, and a titanium nitride, which is also used as an upper electrode, are promising.

EXPERIMENT 3

First, the inventors have been examined the effect of a titanium oxide film (hereinafter, a "TiO film") as a protective film.

Figure 5:
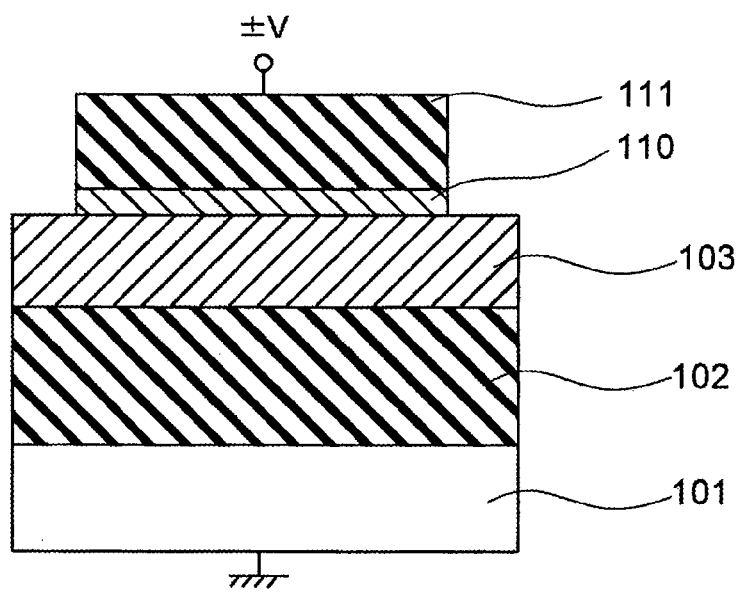
FIG. 5 is a schematic cross-sectional view of a flat capacitor which applies to a capacitor structure having a single layer ZrO film in order to evaluate the effect of a protective film used to a capacitor structure according to one embodiment of the invention.

FIG. 5 shows a capacitor structure including, on semiconductor substrate 101, which is mono-crystalline silicon, lower electrode 102 made of a CVD-TiN film, dielectric film 103 made of a polycrystalline ZrO film, first protective film 110 made of a TiO film, and upper electrode 111 made of a CVD-TiN film. The capacitor structure in this experiment is not three-dimensional semiconductor memory device as explained above, and is constructed as a flat capacitor to achieve an easily manufacturable structure for evaluating its characteristics. For the purpose of comparison with Experiment 1, the dielectric film does not have a ZAZ structure, but a single film of a ZrO film.

As in Experiment 1, lower electrode 102 made of a CVD-TiN film is formed on semiconductor substrate 101 with a thickness of 10 nm, and a ZrO film is then formed for dielectric film 103. As in Experiment 1, the ZrO film is formed to have a thickness of 6 nm by an ALD method using TEMAZ and ozone at 250° C. The ZrO film just formed by the ALD method is in a microcrystalline state. TEMAZ was used for a Zr precursor here, but the precursor is not limited to TEMAZ. Ozone was used as a reaction gas, but the reaction gas is not limited to ozone. For example, the reaction gas can be $H_2O$ (steam). Dielectric film 103 has a thickness of 6 nm here, but may have a different thickness, for example, a thickness between 5 and 8 nm.

It is preferable to set a film forming temperature within the range from 210° C. to 280° C. No reaction will take place below 210° C., and a decomposition reaction will occur in a gas phase if a temperature is above 280° C. In both cases, a film is difficult to be formed.

While Experiment 1 illustrates a CVD-TiN film formed on a ZrO film, Experiment 3 here shows that a first protective film made of a TiO film is formed at a temperature at which no crystal growth of a ZrO film occurs. The first protective film is formed to have a thickness of 1 nm by an ALD method at 250° C. with a reaction gas of ozone and a Ti precursor of TTIP (titanium tetra-isopropoxide: $Ti(OCHMe_2)_4$). Specifically, the film forming process by an ALD method includes the steps of (1) introducing the Ti precursor in a reaction chamber where a semiconductor substrate is installed and then adsorbing the Ti precursor on the surface of the microcrystalline ZrO film, which is to be a dielectric film, as an atomic layer level, (2) nitrogen-purging the remaining Ti precursor in a gas phase, (3) introducing ozone and oxidizing the adsorbed Ti precursor, and (4) nitrogen-purging the remaining ozone in a gas phase. The film formation was developed by repeating the fundamental sequence including the four steps above until the film has a thickness of 1 nm. A film formation by an ALD method is desirable in that it has a better step coverage and is easily applicable to a three-dimensional structure because the formation uses a surface adsorption reaction. A TiO film at the stage of film formation by an ALD method is in an amorphous state. Here, TTIP was used as a Ti precursor, but the Ti precursor is not limited to TTIP. TiMCTA (methylcyclopentadienyl tris(dimethylamino) titanium: $(MeCp)Ti(NMe_2)_3$) can be used for the Ti precursor. Ozone was used for a reaction gas, but the reaction gas is not limited to ozone, and may use, for example, $H_2O$. The film formation temperature was set 250° C., but may be preferably within the range from 210° C. to 280° C. No reaction will take place below 210° C., and a decomposition reaction will occur in a gas phase if a temperature is above 280° C. In both cases, an ALD film formation is prohibited.

Then, a CVD-TiN film, which is to be upper electrode 111, was formed. As in lower electrode 102, the CVD-TiN film for upper electrode 111 was formed to have a thickness of 10 nm by a CVD method at 380° C. to 600° C., preferably at 450° C., in consideration of its application to a three-dimensional structure.

After upper electrode 111 was formed, a mask material (not shown) with a known area has been formed on upper electrode 111, and upper electrode 111 was etching-removed using the mask material as a mask. As a result, a capacitor structure was formed as shown in FIG. 5.

Figure 6:
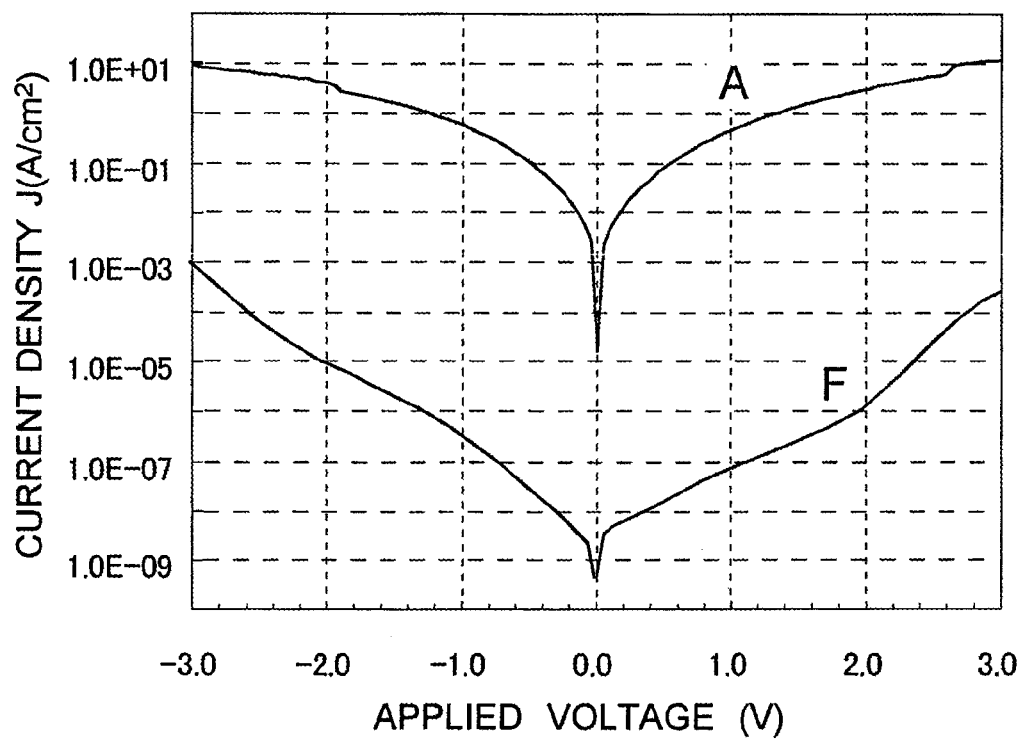
FIG. 6 is a graph illustrating the characteristic of leakage current in the capacitor of FIG. 5 to which a titanium oxide film applies as a protective film.

FIG. 6 illustrates the leakage current characteristic of the capacitor shown in FIG. 5. The horizontal axis indicates a voltage applied to the upper electrode, and the vertical axis shows a leakage current value per unit area, which corresponds to an applied voltage. The characteristic identified by Reference A is a leakage current characteristic when a ZrO film as depicted as Reference A in FIG. 2 has a thickness of 6 nm. Reference F illustrates a leakage current characteristic when the capacitor includes first protective film 110 made of a TiO film with a thickness of 1 nm. When a voltage of +1 V is applied, the leakage current without first protective film 110 (Reference A) is 2 E-2($A/cm^2$), and the leakage current with the first protective film 110 (Reference F) is 7 E-8 ($A/cm^2$). As specified from the comparison in FIG. 6, a capacitor with first protective film 110 made of a TiO film having a thickness of 1 nm decreases the leakage current by five exponents, compared to one without first protective film 110, and shows dramatic improvement.

The result represents that, during a process for forming the upper electrode at a temperature of 450° C., the TiO film functions as a protective film for effectively preventing the generation of damage in heat treatment under a reducing environment or for the secondary growth in crystal grains of the microcrystalline ZrO film, which is to be dielectric film 103.

According to the experiment by the inventors, a TiO film having a film thickness of 1 nm or more is amorphous shortly after its formation, but polycrystalline after a TiN film is formed at a film forming temperature of 450° C. The TiO film was identified as behaving as a conductor, rather than a dielectric because it shows no change in a $SiO_2$ equivalent oxide thickness (EOT: A film thickness obtained by equivalently converting a capacitance per the unit area of an electrode using the permittivity 3.9 of $SiO_2$). Therefore, a polycrystalline titanium oxide film obtained by heat treatment to a TiO film having a thickness of 1 nm or more is not a dielectric, but functions as part of an upper electrode. This is thought to be caused by the facts of (1) the Schottky barrier is originally low in the combination of titanium nitride and titanium oxide, and (2) titanium oxide behaves as a semiconductor by the presence of impurities or oxygen deficiency.

When first protective film 110 made of a TiO film is formed after the dielectric film is heat-treated for a few minutes at 400° C., the leakage current is identified to deteriorate as that in Reference A in FIG. 2. The leakage current is also found to increase at 350° C. However, no change in leakage current was acknowledged with heat treatment at 300° C. In other words, as to the film formation temperature (250° C.) in the ALD method for a dielectric film, the temperature of 300° C., which is higher by 50° C., leads a less secondary growth in crystal grains and is found to have no problem in a practical sense. Based on further evaluation, there is no practical problem unless a temperature over the film forming temperature of the ALD method for a dielectric film by 70° C. is set. Because the temperature range (210° C. to 280° C.) in the ALD method for the microcrystalline ZrO film is consistent with the temperature range 210° C. to 280° C.) in the ALD method for the first protective film, any temperature within the temperature range would fall within the temperature difference of 70° C. Of course, it is preferable not to perform unnecessary heat treatment between the microcrystalline ZrO film formation and the first protective film formation. As such, the first protective film made of a TiO film should be formed before the polycrystallization of the ZrO film progresses.

According to the experiment by the inventors, the desirable effect of the protective film for reducing the leakage current of the TiO film formed on the dielectric made of a ZrO film is manifested from a film thickness of 0.4 nm, and is preferable to have a film thickness of 1 nm or more. When a film thickness is 1 nm or more, an amorphous state during film formation changes into a polycrystalline state at the forming temperature of upper electrode 111, and the formation of an energy band with crystallization and the formation of an energy level within a band gap derived from, for example, oxygen deficiency make it possible for the TiO film to function as a conductor, i.e., electrode, thereby showing no change in the EOT. The TiO film, which is to be the first protective film, is preferable to have a thickness of 5 nm or less. When the thickness is over 5 nm, damage, such as crack, may occur due to the crystallization of the TiO film itself, and the damage may transfer to the dielectric film. In this sense, a desirable film thickness of the first protective film formed on a dielectric made of a ZrO film falls within the range from 0.4 to 5.0 nm. A film thickness below 0.4 nm may not obtain the effect of reducing leakage current. More preferably, the film thickness of the first protective film is within 1 to 2 nm.

A dielectric film having a higher permittivity can be obtained in the progress of densification together with the secondary growth of crystal grains in the ZrO film, by means of heating at the time of the formation of upper electrode 111 after forming first protective film 110 made of a TiO film. The heat treatment may be performed separately from the formation of upper electrode 111. As described above, a TiO film having a thickness of 1 nm or more is also converted to polycrystalline at the time of the formation of upper electrode 111. As a means for promoting this crystallization, heat treatment under a reducing atmosphere is also effective. For example, using ammonia ($NH_3$) as the reducing atmosphere may cause the reduction-elimination of organic impurities contained in an amorphous TiO film, the introduction of oxygen deficiency within the TiO film (transition to low oxidation state, i.e., $TiO_x$ where x is a positive real number less than 2), or the introduction of nitrogen impurities, by performing heat treatment for 2 to 20 minutes at 380° C. to 460° C., and thus can promote crystallization. Therefore, it is effective to preliminarily convert a TiO film, which is first protective film 110, and a microcrystalline ZrO film, which is to be a dielectric 103, into a polycrystalline state by heat treatment under ammonia or hydrogen atmosphere before forming a TiN film, which is to be upper electrode 111. Because $TiCl_4$ and $NH_3$ are used as source gases to form a TiN film, which is to be upper electrode 111, a method of performing heat treatment as preliminary treatment under ammonia atmosphere shortly before forming a TiN film after installing a semiconductor substrate within a TiN film forming apparatus. In this case, the process can be simplified because heat treatment under reducing atmosphere within a TiN film forming apparatus can be performed.

A portion of a TiO film, which is first protective film 110, may be nitrided. For example, by changing the TiO film to an oxynitride such as a TiON film or the quality of a film doped with nitrogen atom as impurities, the conductivity of the protective film increases. Performing heat treatment under ammonia atmosphere as described above can actively develop nitriding. The N density in the TiO film falls within the range from 1E19 [atoms/cc] to 1E21 [atoms/cc], and, preferably, is about 1E20 [atoms/cc]. However, the doping amount can be adjusted in accordance with a manufacturing environment, referring to the C-V characteristic of a capacitor actually manufactured.

In other words, a TiO film as the first protective film can be evaluated as having a function of prohibiting a dielectric film which comprises zirconium oxide as a primary constituent from being directly exposed to the reducing atmosphere with a high temperature, such as $NH_3$, when forming a TiN electrode.

A poly-crystallized TiO film having a thickness of 1 nm or more functions not only as a protective film for reducing leakage current of a dielectric, but also as a portion of an upper electrode. A TiO film having a film thickness of 0.4 nm or more but less than 1 nm remains in amorphous state, not being poly-crystallized at the heat treatment temperature for forming an upper electrode. Therefore, this TiO film does not function for an upper electrode, but functions for a protective film for reducing leakage current.

EXPERIMENT 4

A TiN film, as a protective film, is now evaluated.

Although a TiN film is used as an upper electrode, it is not formed by a CVD method, but by an ALD method, which allows a film formation at a temperature where a secondary growth of crystal grains of a microcrystalline ZrO film is not accompanied, and where an increase in oxygen deficiency within an dielectric film or a diffusion of impurities, such as nitrogen, into the dielectric film may hardly occur. The structure of a capacitor is identical to the structure depicted in FIG. 5, but both of first protective film 110 and upper electrode 111 are TiN films, and the TiN film constituting first protective film 110 is integrated at the film forming stage. Therefore, the final structure is identical to the structure depicted in FIG. 1.

First, all films up to a microcrystalline ZrO film are formed as in Experiment 3, and then first protective film 110 made of a TiN film, rather than a TiO film, is formed by an ALD method. Hereinafter, a TiN film formed by the ALD method is referred to as "ALD-TiN film".

An ALD-TiN film, which is first protective film 110, is formed by an ALD method at 250° C. with a Ti precursor of titanium tetrachloride ($TiCl_4$) and a reaction gas of ammonia ($NH_3$), and has a thickness of 1 nm. Ammonia was supplied in a plasma state. Specifically, the film forming process by an ALD method includes a fundamental sequence of (1) introducing the Ti precursor in a reaction chamber where a semiconductor substrate is installed and then adsorbing the Ti precursor on the surface of a dielectric film, as an atomic layer level, (2) nitrogen-purging the remaining Ti precursor in a gas phase, (3) introducing the plasmic ammonia and decomposing the adsorbed Ti precursor, and (4) nitrogen-purging the remaining ammonia in a gas phase. The film formation was developed by repeating the fundamental sequence of the above four steps until the film thickness becomes 1 nm. A film formation by the ALD method is desirable in that it has a better step coverage and is easily applicable to a three-dimensional structure because the formation uses a surface adsorption reaction. Because plasmic-change of ammonia generates nitrogen radical having a high energy level and thus improves reactivity, a nitriding reaction can be promoted even at a low temperature of 250° C. Here, $TiCl_4$ was used as a Ti precursor, but the Ti precursor is not limited to $TiCl_4$. TDMAT (tetrakis (dimethylamino) titanium: $Ti[N(CH_3)_2]_4$) or TDEAT(tetrakis (diethylamino) titanium: $Ti[N(C_2H_5)_2]_4$) can be used. These Ti precursor gases can be used singly, or in combination of two or more thereof. The reaction gas is not only ammonia, but also nitrogen gas ($N_2$), $N_2+NH_3$, $N_2+H_2$, etc. Even when TDMAT or TDEAT is used as a Ti precursor, a reaction gas is supplied in a plasma state. The film forming temperature was set at 250° C., but is preferable if it is within 210° C. to 280° C. No reaction will take place below 210° C., and a decomposition reaction will occur in a gas phase if a temperature is above 280° C. In both cases, an ALD film formation is prohibited.

Then, a CVD-TiN film, which is to be upper electrode 111, was formed. Similar in lower electrode 102, the CVD-TiN film for upper electrode 111 was formed to have a thickness of 10 nm by a CVD method at 380° C. to 600° C., preferably at 450° C., in consideration of its application to a three-dimensional structure. By heat treatment during the formation of the upper electrode, an ALD-TiN film, which is first protective film 110, becomes the upper electrode formed integrally with the CVD-TiN film by the crystal growth and the reduction-elimination of organic matters remaining in the ALD-TiN film, and the microcrystalline ZrO film of dielectric film 103 changes into a polycrystalline ZrO film.

Figure 7:
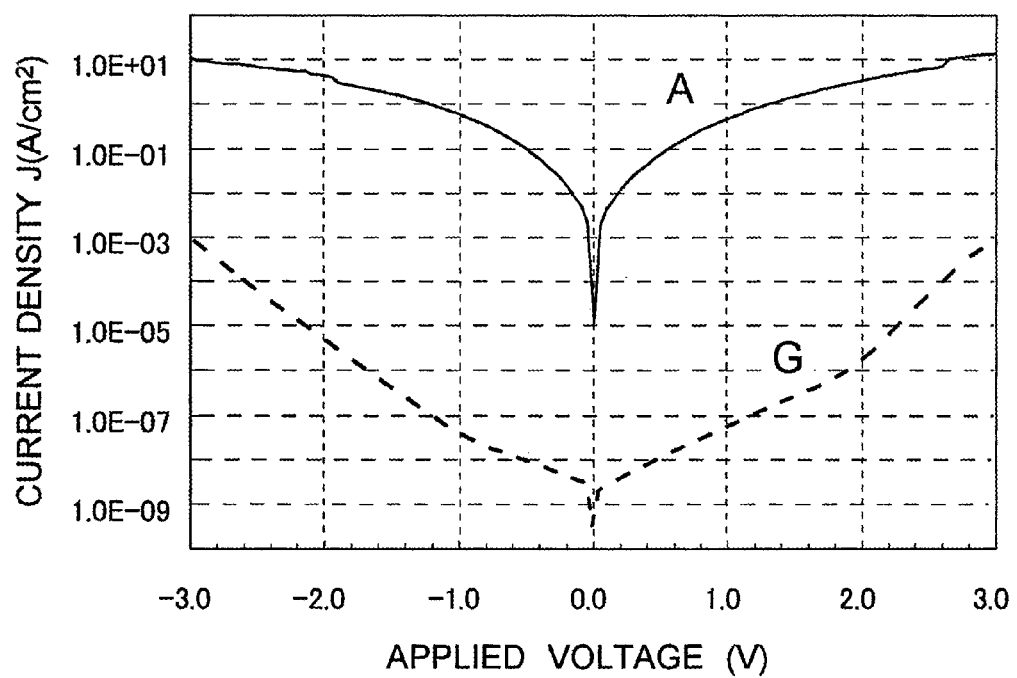
FIG. 7 is a graph illustrating the characteristic of leakage current in the capacitor of FIG. 5 to which a titanium nitride film applies as a protective film.

FIG. 7 illustrates the leakage current characteristic of the capacitor in this experiment. The horizontal axis indicates a voltage applied to upper electrode 111, and the vertical axis shows a leakage current value per unit area, which corresponds to an applied voltage. The characteristic identified by Reference A is a leakage current characteristic when a ZrO film as depicted as Reference A in FIG. 2 has a thickness of 6 nm. Reference G illustrates a leakage current characteristic when the capacitor includes first protective film 110 made of an ALD-TiN film with a thickness of 1 nm. When a voltage of +1 V is applied, the leakage current without first protective film 110 (Reference A) is 2E-2($A/cm^2$), and the leakage current with first protective film 110 (Reference G) is 7E-8($A/cm^2$). As specified from the comparison in FIG. 7, a capacitor with first protective film 110 made of an ALD-TiN film having a thickness of 1 nm decreases the leakage current by five exponents, compared to one without first protective film 110, and shows dramatic improvement.

The first protective film made of an ALD-TiN film is desirable to have a thickness of 0.4 nm or more. The first protective film having a thickness of less than 0.4 nm eliminates the effect of preventing damages, such as crack, caused by a secondary growth of crystal grains of a ZrO film. It is desirable that the first protective film made of an ALD-TiN film has a thickness of 5 nm or less. If the first protective film has a thickness of more than 5 nm, heat treatment during the formation of a CVD-TiN film as upper electrode 111 increases stress over the entire TiN film constituting first protective film 110 and upper electrode 111, and increases leakage current of dielectric film 103, thereby causing the loss of function as a protective film.

According to Experiments 3 and 4, the formation of a titanium compound film as a first protective film prohibits damages caused by a secondary growth of crystal grains of a ZrO film during the formation of a CVD-TiN as an upper electrode. Therefore, leakage current characteristic is found to improve.

Other than the TiO film and the TiN film, a TiON film, for example, may be formed as a titanium compound film, which functions as a first protective film. Moreover, it can be a laminating structure of a TiO film and a TiN film.

EXPERIMENT 5

One embodiment of the present invention, in which a protective film is applied to a dielectric film having a ZAZ structure, is now explained.

In this experiment, it is explained a case where a TiO film is formed as a protective film.

Figure 8:
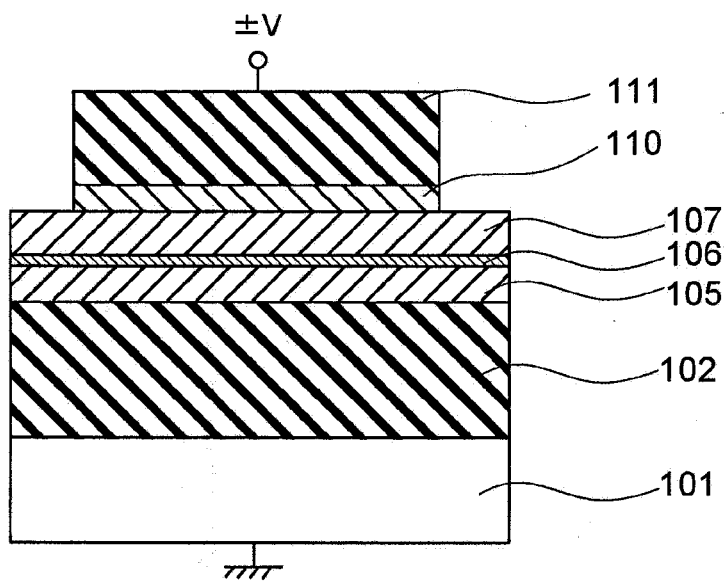
FIG. 8 is a schematic cross-sectional view of a flat capacitor in order to evaluate a capacitor structure according to one embodiment of the invention.

FIG. 8 is a schematic cross-sectional view illustrating the structure of a capacitor according to the invention, which is different from the structure of FIG. 3 in that first protective film 110 made of a TiO film is formed between upper electrode 111 and dielectric film 107. The capacitor structure in this experiment is called a TZAZ structure because a polycrystalline TiO film, i.e., first protective film 110, is combined with a ZAZ structure.

First, as in Experiment 2, all processes up to the formation of a dielectric film having a ZAZ structure are performed. The dielectric film of a ZAZ structure includes, on lower electrode 201, a ZrO film of 3 nm in thickness, which is to be first dielectric film 105, an AlO film of 0.5 nm in thickness, which is to be second dielectric film 106, and a ZrO film of 3 nm in thickness, which is to be third dielectric film 107. Although the present experiment forms first dielectric film 105 and third dielectric film 107 with the same thickness of 3.0 nm, the same thickness is not required. For example, first dielectric film 105 may have a film thickness of 5.0 nm while the third dielectric film has a film thickness of 1.0 nm. As such, both films can have an asymmetrical structure. Although the present experiment includes a single-layer AlO film inserted between the ZrO films, two or more layers of AlO films can be inserted therebetween. However, because a polycrystalline state may not be achieved to provide a high permittivity if the thickness of the ZrO film between the AlO films decreases, it is desirable to make the thickness of each ZrO film to be 1 nm or more. The composite ratio, which is expressed as Z/(Z+M) where Z is the number of zirconium atom and M is the number of aluminum atom in the entire dielectric film, is preferably 0.8 or more.

Then, as in Experiment 3, first protective film 110 made of a TiO film with a thickness of 1 nm is formed by an ALD method. At the stage of film formation, the TiO film is amorphous as described above. As in each experiment above, a CVD-TiN film which is to be upper electrode 111, is formed with a thickness of 10 nm by a CVD method at 450° C., and, likewise, is patterned in the shape of the upper electrode. At the stage of the film formation of upper electrode 111, the ZrO film of the third and first dielectric films continues to change from a microcrystalline state into a polycrystalline state through a secondary growth of crystal grains, where the grain boundary is acknowledged by a transmission electron microscope.

Figure 9:
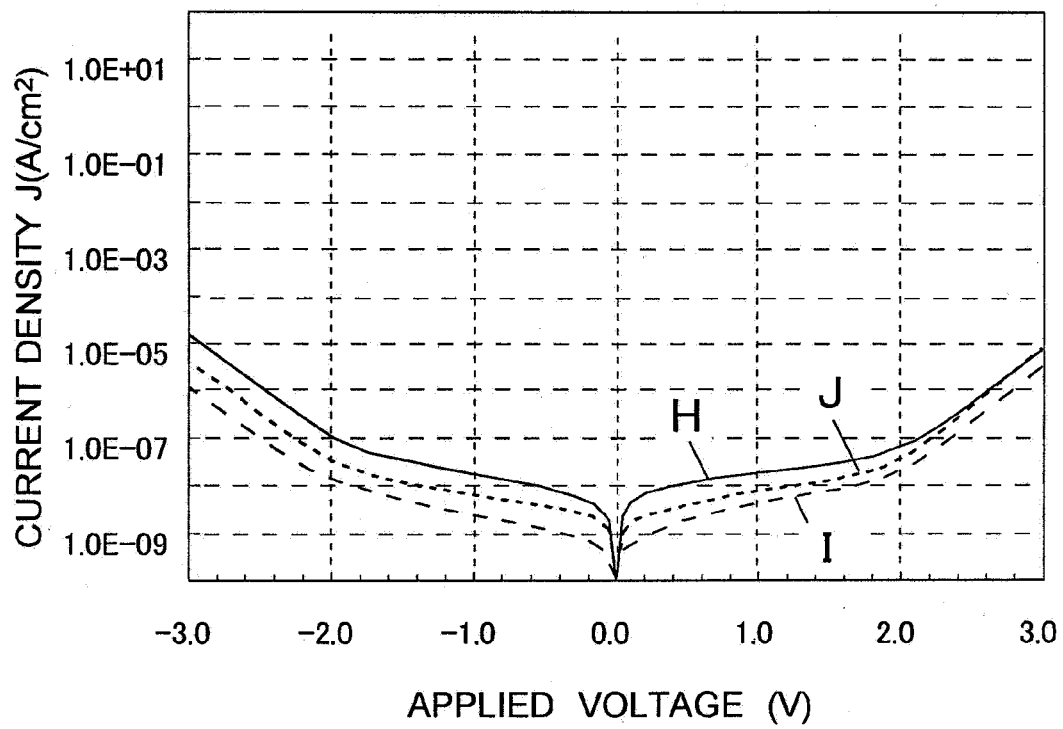
FIG. 9 is a graph illustrating the characteristic of leakage current in the capacitor of FIG. 8 to which a titanium oxide film applies as a protective film.

I-V characteristic of the capacitor formed as above was evaluated, and is illustrated in FIG. 9. In FIG. 9, Reference H shows the I-V characteristic of the capacitor measured after upper electrode 111 has been formed, a Reference I shows the I-V characteristic of the capacitor measured after the upper electrode has been formed and then additionally annealed with nitrogen at 450° C. for six hours, and Reference J shows the I-V characteristic of the capacitor measured after the upper electrode has been formed, annealed with nitrogen at 450° C. for six hours and annealed with hydrogen at 450° C. for two hours.

With respect to Reference H, the applied voltage is −2.0 V or +2.1 V to meet the index current density of 1E-7 (A/cm$^2$). It is understood that the characteristic improves compared to Reference F depicted in FIG. 6.

Reference I shows a better leakage current characteristic in that the applied voltage is −2.5 V or +2.4 V to meet the index current density of 1E-7 (A/cm$^2$). This is a better result than that of Reference D in FIG. 4. Furthermore, Reference J, which is a result after the 2-hour hydrogen annealing, has an applied voltage between −2.3 V and +2.2 V to meet the current density of 1E-7 (A/cm$^2$), and shows a dramatic improvement in leakage current characteristic, compared to Reference E in FIG. 4.

As such, a TZAZ structure according to the invention improves the resistance against hydrogen-annealing, compared to a known ZAZ structure. Therefore, for DRAM, the characteristic of transistors can thus be compatible with that of capacitors, and, accordingly, high reliability and a high yield rate can be accomplished for a device.

Furthermore, it is understood from the result in Experiment 4, a titanium compound film, such as a TiN film, which can be formed by an ALD method, can replace a TiO film as first protective film 110 to accomplish the same result.

In the invention, it is desirable to maintain the process temperature as 300° C. or less at least from the ZrO film formation for the third dielectric film to the titanium compound film for the first protective film. Alternatively, after forming a ZrO film for first dielectric film 105 and forming an AlO film for second dielectric film 106, a ZrO film can be formed as third dielectric film 107 after a 10-minute heat treatment at 380° C. under oxygen atmosphere and a 10-minute heat treatment at 450° C. under nitrogen atmosphere.

Leakage current can be further reduced by the densification and change a dielectric film into polycrystalline state by preliminarily promoting the secondary growth of crystal grains on a ZrO film as first dielectric film 105. In this case, an AlO film of second dielectric film 106 functions as a protective film for first dielectric film 105, and prohibits damages caused by the secondary growth of crystal grains of the ZrO film as first dielectric film 105. Even if a damage, such as crack, is somewhat introduced, the formation of a ZrO film as the third dielectric film may help the third dielectric film to fill the crack, thereby eliminating the damage. It is obvious that the process temperatures for all dielectric film formations can be set at 300° C. or lower, and the first protective film can be then formed. All films formed by an ALD method may be formed in different film forming apparatuses, but are preferable to be subsequently formed in one film forming apparatus.

A ZAZ structure for a dielectric film is designed to obtain a desired EOT. Typically, the film thickness of all ZrO films, i.e., the first and third dielectric films, are adjusted to be 5 to 7 nm, and the AlO film for the second dielectric film is designed to have a EOT of 0.6 nm or less with respect to the total film thickness of the first and third dielectric films.

EXPERIMENT 6

In this experiment, in order to further improve leakage current characteristic, it is explained a capacitor including the structure of Experiment 5 and a TiO film for a second protective film. The second protective film is formed between a CVD-TiN film for lower electrode 102 and a ZrO film for first dielectric film 105.

Figure 10:
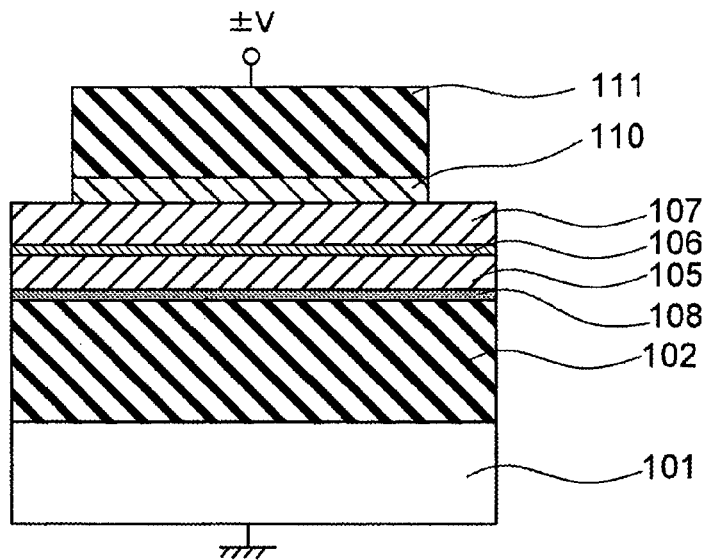
FIG. 10 is a schematic cross-sectional view of a flat capacitor in order to evaluate a capacitor structure according to another embodiment of the invention.

FIG. 10 is a schematic cross-sectional view illustrating a flat capacitor according to this experiment. Unlike to the structure of FIG. 8, FIG. 10 includes second protective film 108 made of a TiO film between a ZrO film of first dielectric film 105 and a CVD-TiN film of second electrode 102.

First, semiconductor substrate 101 was installed in an ALD film forming apparatus, and a TiO film, which is to be second protective film 108, was formed in the same manner for producing first protective film 110 described in Experiment 5. The film was formed by an ALD method at 250° C. with a Ti precursor of TTIP (titanium tetraisopropoxide: Ti(OCHMe$_2$)$_4$) and a reaction gas of ozone so as to have a thickness of about 0.5 nm by five cycles of the ALD fundamental sequence. With respect to this film thickness, the TiO film formed by an ALD is in an amorphous state.

Then, as in Experiment 5, a dielectric film comprising a primary constituent of zirconium oxide, i.e., first dielectric film 105 made of a ZrO film with a thickness of 3 nm, second dielectric film 106 made of aluminum oxide with a thickness of 0.5 nm and third dielectric film 107 made of a ZrO film with a thickness of 3 nm are formed by an ALD method; first protective film 110 made of a TiO film is formed to have 1 nm in thickness; and upper electrode 111 made of a TiN film is formed to have 10 nm in thickness by a CVD method. Although the present experiment forms first dielectric film 105 and third dielectric film 107 with the same thickness of 3.0 nm, the same thickness is not required. For example, first dielectric film 105 can have a film thickness of 5.0 nm while third dielectric film 107 has a film thickness of 1.0 nm. As such, both films may have an asymmetrical structure.

Figure 11:
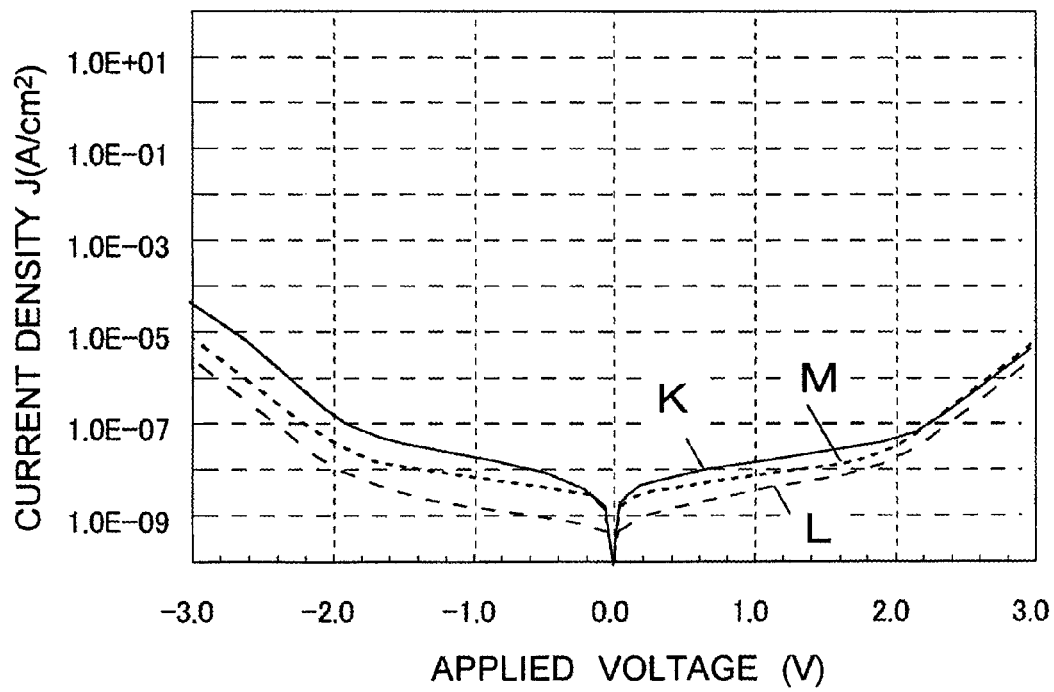
FIG. 11 is a graph illustrating the characteristic of leakage current in the capacitor of FIG. 10 to which a TiO film applies as a protective film.

I-V characteristic of the capacitor formed as above was evaluated, and is illustrated in FIG. 11. In FIG. 11, Reference K shows the I-V characteristic of the capacitor measured after the upper electrode has been formed, Reference L shows the I-V characteristic of the capacitor measured after the upper electrode has been formed and then additionally annealed with nitrogen at 450° C. for six hours, and Reference M shows the I-V characteristic of the capacitor measured after the upper electrode has been formed, annealed with nitrogen at 450° C. for six hours and annealed with hydrogen at 450° C. for two hours.

Compared to the result in FIG. 9, the leakage current here is reduced in the region of low electric field (±2 V range). Absent second protective film 108, the applied voltage of +1 V indicates 3E-8(A/cm$^2$) for Reference H, 3E-9(A/cm$^2$) for Reference I, 1E-8(A/cm$^2$) for Reference J. In contrast, with the second protective film 108 prepared, the applied voltage of +1 V indicates 2E-8(A/cm$^2$) for Reference K, 6E-9(A/cm$^2$) for Reference L, 9E-9(A/cm$^2$) for Reference M, each being further improved.

A TiO film as the second protective film contributes the improvement of the leakage current characteristic if it has a film thickness of 0.4 nm or more. When the film thickness is 1 nm or more, the TiO film changes from an amorphous state into a polycrystalline state by heat treatment. The TiO film as the second protective film has substantially no influence on an increase in the EOT of the entire capacitor after heat treatment during the upper electrode formation, and appears to function as a conductor like the first protective film. Based on the fact that a TiO film as the second protective film has substantially no influence on the effect of improving the leakage current characteristic when the film has 1 nm or 2 nm in thickness, the effect of improving the leakage current characteristic is thought to be saturated. Therefore, a TiO film for the second protective film is desirable to have 0.4 to 2 nm in thickness, and, more preferably, 0.4 to 1 nm in thickness.

As described above, the same TiO film poly-crystallized with a film thickness of 1 nm or more may play different roles according to the location where it has been formed. For example, a TiO film for first protective film 110 may prevent, during heat treatment, any direct exposure to TiCl$_4$ or NH$_3$ (and by-produced HCl or H$_2$) environment, which is used for forming a CVD-TiN film for upper electrode 111, while the surface of a dielectric film having a major constituent of zirconium oxide is exposed.

Meanwhile, a TiO film for second protective film 108 is inserted between the dielectric film and the lower electrode so as not only to further prohibit leakage current but also to improve the adhesion between lower electrode 102 and dielectric film 105, thereby preventing a partial peel-off between the lower electrode and the dielectric film during heat treatment.

A TiO film for the second protective film can also promote the crystallization of zirconium oxide, and is found to help manufacturing a dielectric film with a higher permittivity if any.

Figure 16:
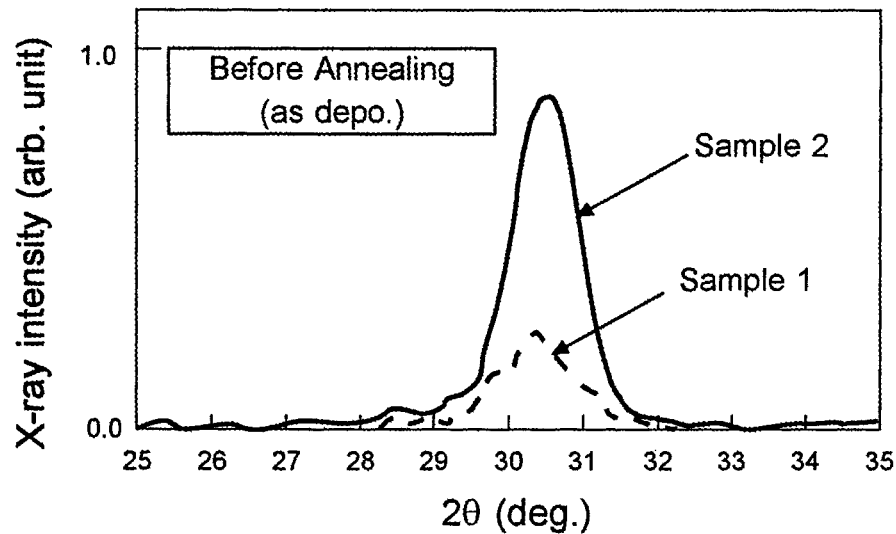
FIG. 16 is a view illustrating a XRD result before annealing in a sample structure of FIGS. 18A and 18B.
Figure 17:
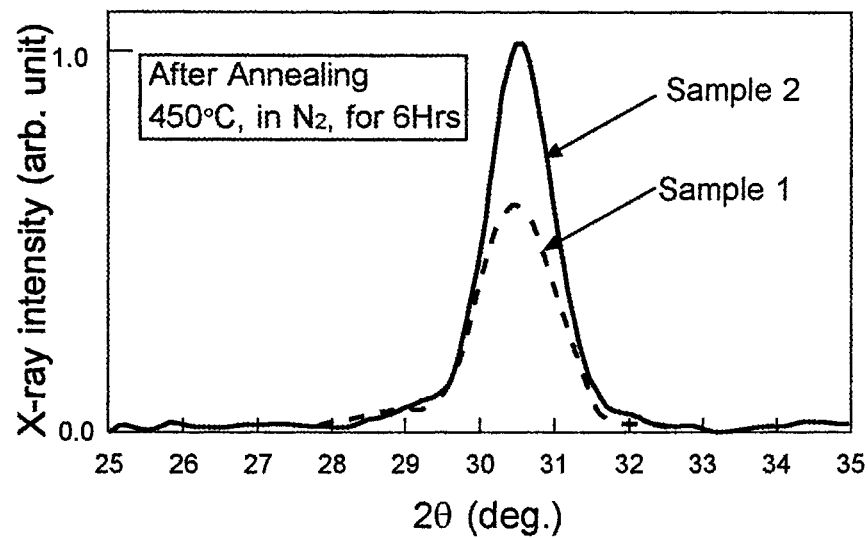
FIG. 17 is a view illustrating a XRD result after annealing in a sample structure of FIGS. 18A and 18B.

FIGS. 16 and 17 illustrate the outcome of an X-ray diffraction (XRD) of a dielectric film having a primary constituent of zirconium oxide with 6.6 nm in thickness when there is a TiO film for the second protective film (Sample 2) and when there is no TiO film (Sample 1). FIG. 16 shows an XRD result shortly after film formation (as depo.) FIG. 17 depicts an XRD result after heat treatment (annealing) for six hours at 450° C. under nitrogen atmosphere. This annealing represents the heat load generated during the growth of a CVD-TiN for an upper electrode in a process for manufacturing DRAM or during the film formation of a polycrystalline SiGe film doped with boron (B) by a CVD method, as explained later.

Figure 18A:
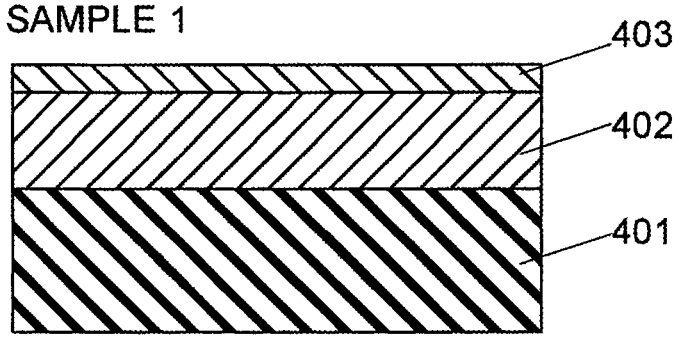
FIGS. 18A and 18B are views illustrating sample structures used to obtain the data of FIGS. 16 and 17.
Figure 18B:
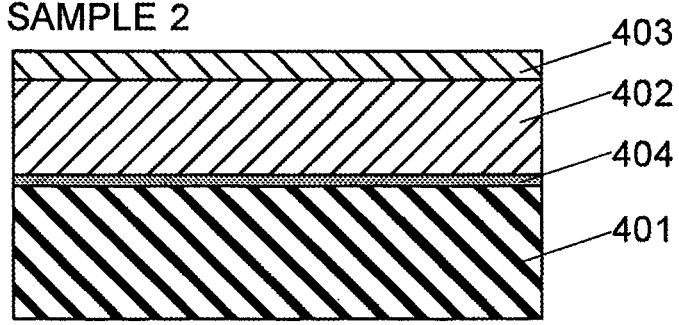

FIG. 18 illustrates the structures of the samples used in FIGS. 16 and 17. These samples have TiN film 401 with 10 nm in thickness, which is to be lower electrode 102, formed on a silicone substrate (not shown). Additionally, Sample 2 (FIG. 18B), which has the second protective film, includes TiO film 404 formed by the aforementioned ALD method with a Ti precursor of TiMCTA so that the film has a thickness of about 0.5 nm formed by five ALD cycles. Then, for the dielectric film having a primary constituent of ZrO, film 402 is formed by the aforementioned ALD method so as to contain approximately 3 at % of AlO in the composite ratio expressed by Al/(Al+Zr). Then, TiO film 403 for the first protective film is formed by an ALD method with about 1.0 nm in film thickness, which was formed by ten ALD cycles. As to Sample 1 (FIG. 18A), which has no second protective film, TiN film 401 for the lower electrode is formed on a silicone substrate (not shown), and film 402 for the dielectric film having a primary constitute of ZrO is formed directly on TiN film 401. TiO film 403 for the first protective film is likewise formed.

In FIG. 16, as to a film shortly after film formation without heat treatment, Sample 2 with the second protective film has a high peak intensity around 30.5° where zirconium oxide is crystallized. In FIG. 17, Sample 2 having the secondary protective film also has high peak intensity and a good crystallizability. It should be noted that Sample 2 having the second protective film has a small rate of change in peak intensity, in particular, before and after annealing, while its absolute value is large (See Table 1). This shows that Sample 2 having the second protective film has already been crystallized (i.e., a primary growth of crystal grains) sufficiently shortly after film formation, and that a secondary growth of crystal grains is prohibited during the upper electrode formation.

TABLE 1

Change in XRD Peak Intensity

|  | Before Annealing (FIG. 16) | After Annealing (FIG. 17) | Rate of Change |
|---|---|---|---|
| Sample 2 | 0.87 | 1.00 | 1.15 |
| Sample 1 | 0.25 | 0.59 | 2.34 |

Table 1 shows the peak intensities of an XRD identified in FIGS. 16 and 17, and the rates of change evaluated therefrom.

While, in Experiment 6, a TiO film for second protective film 108 is formed by an ALD method, the inventors here found that the same result can be achieved in the case that a titanium oxide film is obtained by oxidizing the surface of the lower electrode 102 made of titanium nitride prior to the film formation of a dielectric film having a primary constituent of zirconium oxide. The surface of the lower electrode may be oxidized by exposing the surface to an O$_3$ atmosphere for about 10 to 30 minutes at 250° C.

The inventors also found that the same effect can be achieved by providing a titanium oxide film formed by an additional ALD method on a titanium oxide film obtained by oxidizing the surface of the lower electrode.

Figure 13:
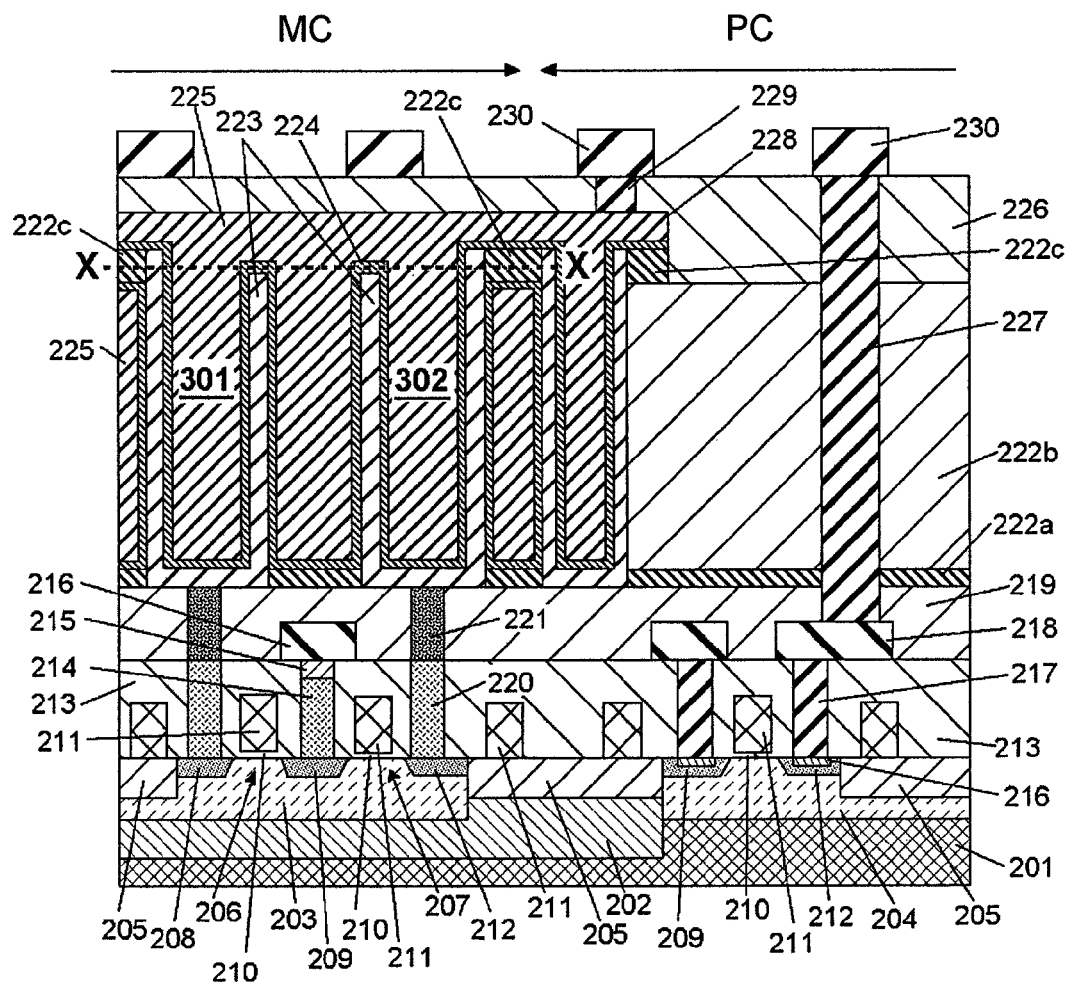
FIG. 13 is a cross-sectional schematic view generally illustrating the entire structure of DRAM, which is semiconductor memory device in the invention.

The film thickness of the second protective film formed by an ALD method is an important issue which should not be overlooked. For example, a DRAM device in FIG. 13 has a lower electrode which is divided by units of cell and is insulated. However, the second protective film formed by an ALD method is formed over the entire surface. That is, the film is also formed between adjacent lower electrodes. If a TiO film for the second protective film formed by an ALD method has a thickness of 1 nm or more, the film would function as a conductor and thus short-circuit the lower electrodes to destroy the desired function as a device. Therefore, for a device with the structure as depicted in FIG. 13, the film thickness of the second protective film formed by an ALD method should be less than 1.0 nm, preferably 0.5 nm or less.

However, given the fact that a film thickness representing the saturation of the second protective film's effect of improving the leakage current characteristic is 1 nm or more, an ALD method being performed on the entire surface may not prohibit leakage current between adjacent capacitors although the method may help reducing the leakage current of the dielectric film.

To avoid this issue, it is possible to compensate the film thickness required as the second protective film by oxidizing the lower electrode before the formation by an ALD as described above.

The second protective film formed as above does not short-circuit adjacent lower electrodes surely because the TiO film formed by oxidizing the lower electrode is formed only on the lower electrode.

Alternatively, the second protective film may also be formed only by oxidization as described above. However, oxygen may substantially increase the resistance of the lower electrode because oxygen diffuses along the grain boundary of the titanium nitride film constituting the lower electrode. When oxidization cannot be sufficiently done to avoid such an increase in resistance and the oxidization of the lower electrode alone is not enough to obtain a sufficient film thickness of titanium oxide as the second protective film, the combination of oxidization and an ALD method is recommended.

The formation of the second protective film (the formation by oxidization and by an ALD method), the formation of the dielectric film (the formation by an ALD method) and the formation of the first protective film (the formation by an ALD method) may be performed subsequently in the same reaction chamber, thereby simplifying the process.

Figure 12:
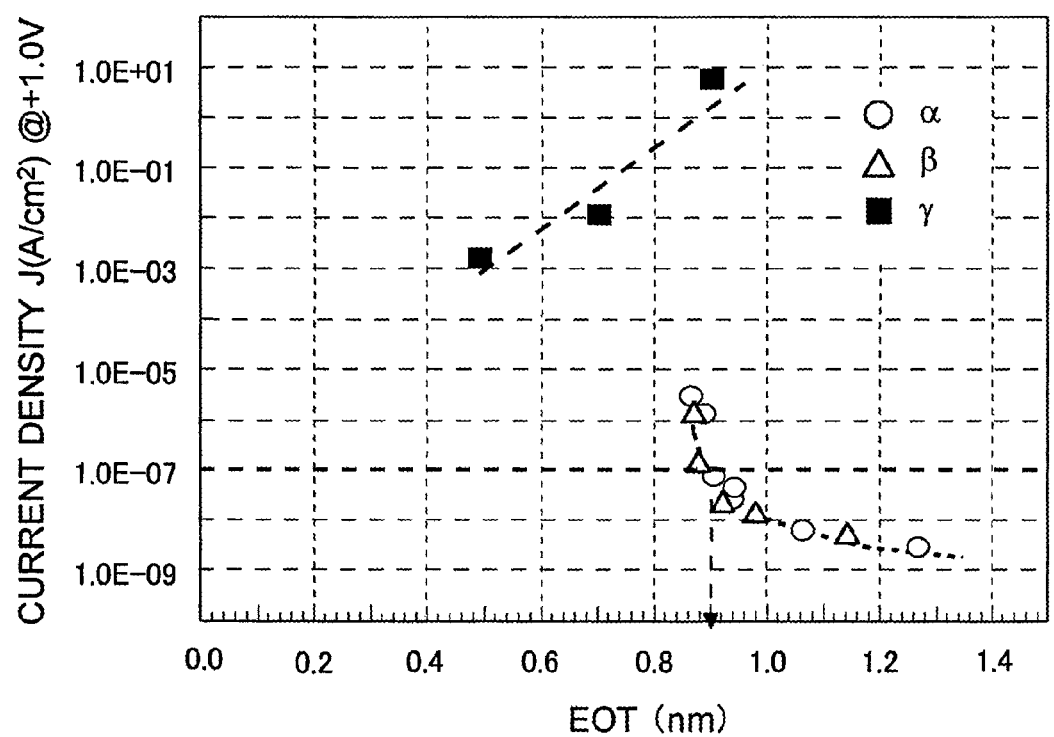
FIG. 12 is a view illustrating the relationship between the leakage current characteristic and an EOT.

FIG. 12 shows the relation between the EOT and the leakage current characteristic with respect to +1 V of a TZAZT structure (β) as described in Experiment 6 and a TZAZ structure (α) as described in Experiment 5. For a reference, a single layer structure (γ) of a ZrO film as described in Experiment 1 is depicted together.

As shown in FIG. 12, the TZAZ structure (α) and the TZAZT structure (β) satisfy the feature that an EOT over 0.9 nm has a value of $1E-7(A/cm^2)$ or less. Therefore, for DRAM of F70 nm class, an EOT of 1.2 nm or less can be sufficiently achieved.

(Exemplary Embodiment)

Figure 14:
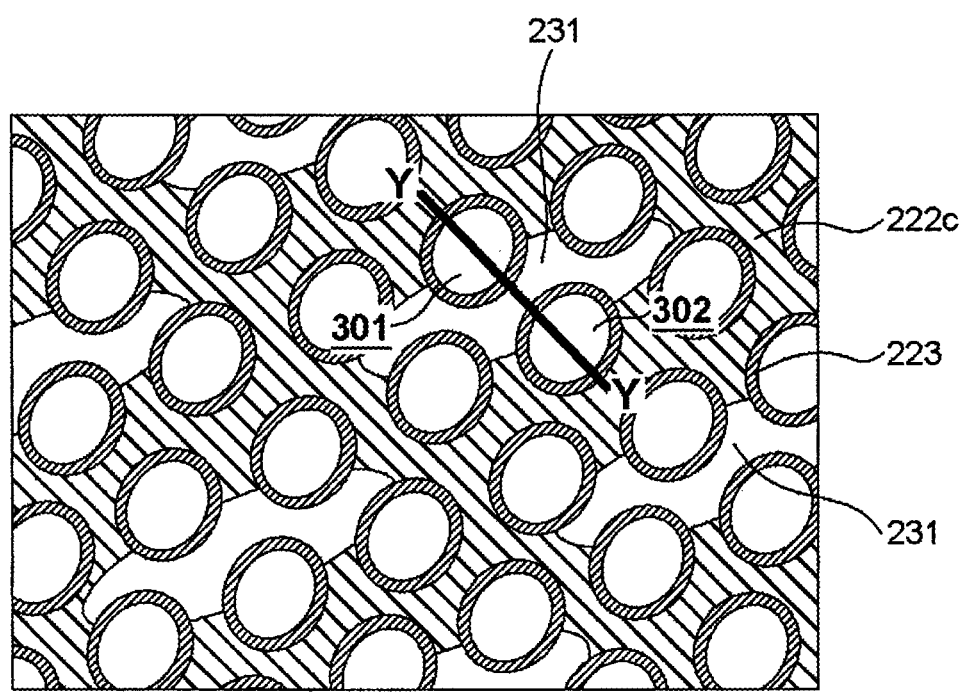
FIG. 14 is a top, cross-sectional view of the structure of FIG. 13 taken along line X-X.

In this exemplary embodiment, a semiconductor memory device in which a TZAZ structure or a TZAZT structure is applied to a three-dimensional capacitor is explained in reference to FIGS. 13 to 15.

Referring to a schematic cross-sectional view of FIG. 13, the entire structure of DRAM as a semiconductor memory device is generally described.

n-Well 202 is formed on p-type silicone substrate 201, and first p-well 203 is formed within n-well 202. Second p-well 204 is formed on the region with the exclusion of n-well 202, and is separated from first p-well 203 by element isolation area 205. First p-well 203 and second p-well 204 conveniently represent, respectively, memory cell area MC where a plurality of memory cells is arranged and peripheral circuit area PC.

First p-well 203 has switching transistors 206 and 207 including gate electrodes which are to be word lines with components of each memory cell. Transistor 206 includes drain 208, source 209, and gate electrode 211 with gate insulation film 210 inserted therebetween. Gate electrode 211 has a polycide structure laminating tungsten silicide on polycrystalline silicone or a polymetal structure laminating tungsten.

Transistor 207 includes common source 209, drain 212, and gate electrode 211 with gate insulation film 210 inserted therebetween. The transistor is covered by first interlayer insulation film 213.

To be connected to source 209, a contact hole installed on a certain area of first interlayer insulation film 213 is filled with polycrystalline silicone 214. Metallic silicide 215 is provided on the surface of polycrystalline silicone 214. Bit line 216 made of tungsten nitride and tungsten is provided to be connected to metallic silicide 215. Bit line 216 is covered by second interlayer insulation film 219.

For the connection to drains 208 and 212 of the transistors, contact holes are formed on a certain area of the first and second interlayer insulation films 213 and 219, and each contact hole is filled with silicone to provide silicone plug 220. Conductive plug 221 made of metal is provided on the top of silicone plug 220.

A capacitor is formed to be connected to conductive plug 221. Third interlayer insulation film 222a and fourth interlayer insulation film 222b, which are to form lower electrodes, are laminated on second interlayer insulation film 219. Fourth interlayer insulation film 222b is reserved on the peripheral circuit area, and lower electrodes 223 are formed in a crown shape on the memory cell area. Then, fourth interlayer insulation film 222b on the memory cell area is eliminated. The capacitor is configured to have dielectric film 224 which covers the outer wall exposed by removing fourth interlayer insulation film 222b and the inner wall of lower electrode 223, and upper electrode 225 which covers the entire memory cell area. Support film 222c is provided on a portion of the side of the top portion of lower electrode 223. Support film 222c is to connect some of a plurality of the adjacent lower electrodes, and thus to increase its mechanical strength and avoid the collapse of the lower electrodes themselves. Because there is a space below support film 222c, dielectric film 224 and upper electrode 225 are also provided on the surface of the lower electrodes exposed to the space. FIG. 13 depicts two capacitors 301 and 302. Lower electrode 223 is made of titanium nitride (TiN) formed by a CVD, which has an outstanding step coverage. The capacitor is covered by fifth interlayer insulation film 226. The material for the plugs is changeable depending on the lower electrode of the capacitor; the material for the plugs is not limited to silicone, but can be made of the same material as the lower electrode of the capacitor or of a different material. The structure of dielectric film 224 and upper electrode 225 is described in detail with a manufacturing process later.

A transistor, which constitutes a peripheral circuit, includes source 209, drain 212, gate insulation film 210, and gate electrode 211 on second p-well 204. A contact hole which is installed in a certain area of first interlayer insulation film 213 is filled with metallic silicide 216 and tungsten plug 217 so that the hole is connected to drain 212. First wiring layer 218 which is made of tungsten nitride and tungsten is provided to be connected to tungsten plug 217. A part of first wiring layer 218 is connected metallic via plug 227 to second wiring layer 230 made of aluminum or copper. Metallic via plug 227 is configured to penetrate second interlayer insulation film 219, third interlayer insulation film 222a, fourth interlayer insulation film 222b and fifth interlayer insulation film 226. Upper electrode 225 of the capacitor arranged in the memory cell area is withdrawn as wiring 228 from a certain area to the peripheral circuit area, and is connected to second wiring layer 230 made of aluminum or copper by intervening metallic plug 229 formed in a certain area of fifth interlayer insulation film 226. DRAM is developed by repeating the steps, as necessary, of forming interlayer insulation films, forming contacts, and forming wiring layers.

FIG. 14 is a schematic plane view of FIG. 13 taken along line X-X, excluding the dielectric film and the upper electrode. The line Y-Y in FIG. 14 corresponds to the line X-X in FIG. 13. Support film 222c, which covers the entire outside of each lower electrode 223, includes a plurality of openings 231 over the entire memory cell area in a way of extending over a plurality of the lower electrodes. Each lower electrode 223 is so configured that part of its circumference is in contact with any one of openings 231. The support film with the exclusion of the openings is continuously configured so that the lower electrodes are connected to each other via the support film. The support film also helps avoiding the collapse of the lower electrodes themselves because the film may relatively extend the horizontal length with respect to the aspect ratio, i.e., the vertical/horizontal ratio. When cells are miniaturized with a high degree of integration, the aspect ratio, i.e., the vertical/horizontal ratio, of the lower electrode of the capacitor increases, and would thus cause the collapse of the lower electrode during its manufacturing without a means to support the lower electrode. FIG. 14 shows an example of opening 231 overlapping six lower electrodes with a central focus on an area between capacitors 301 and 302. Therefore, in FIG. 13, the upper portions of capacitors 301 and 302 and of an area between the capacitors 301 and 302, which correspond to the areas in FIG. 14, are configured to have no support film.

As such, with the support film prepared, a better film forming method with a better coverage is required to form a dielectric film and an upper electrode on the surface of the lower electrode below the support film.

A process for manufacturing a capacitor according to the invention is now described with the exclusion of the other processes in a method of manufacturing DRAM as the semiconductor memory device described above. FIG. 15 is a cross-sectional view of a process for manufacturing one capacitor depicted in FIG. 13. For clarity, a transistor or a first interlayer insulation film on semiconductor substrate 201 is omitted.

Figure 15A:
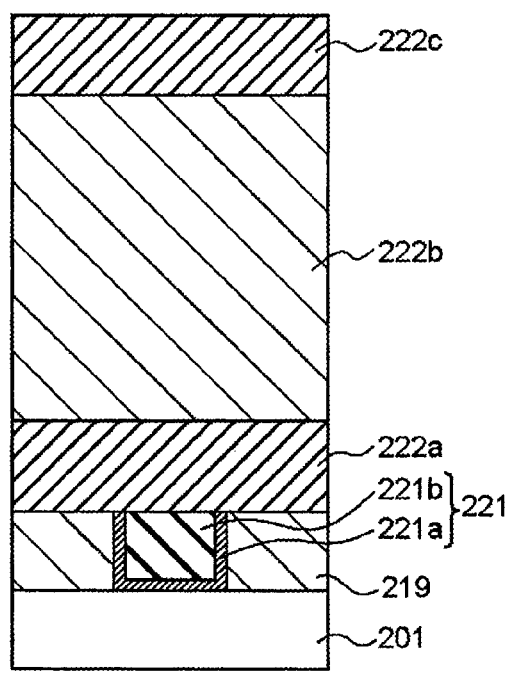
FIGS. 15A to 15I are cross-sectional views illustrating a manufacturing process for the capacitor of FIG. 13.

First, as shown in FIG. 15A, first interlayer insulation film 219 is formed on semiconductor substrate 201 made of monocrystal silicon. Then, a contact hole is formed on a predetermined location, and barrier metal film 221a and metal film 221b are formed on the entire surface. Then, barrier metal film 221a and metal film 221b, which have been formed on the second interlayer insulation film is removed by a CMP method to form conductive plug 221. Then, third interlayer insulation film 222a made of a silicon nitride film, fourth interlayer insulation film 222b made of a silicon oxide film, and support film 222c made of a silicon nitride film are formed on the entire surface.

Figure 15B:
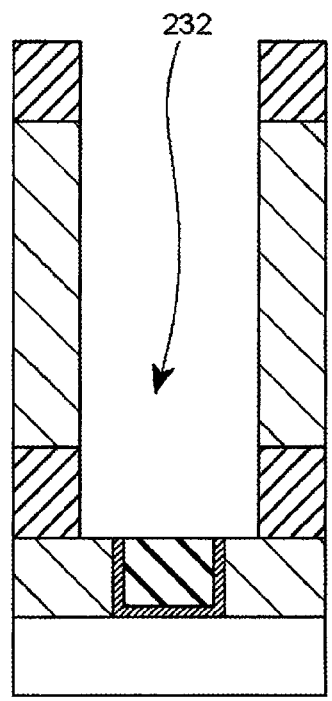

Then, as shown in FIG. 15B, cylinder hole 232 is formed in support film 222c, fourth interlayer insulation film 222b and third interlayer insulation film 222a by lithography and dry etching. The cylinder hole has a circular plane profile having a diameter of 60 nm. The closest distance from the adjacent cylinder hole is 60 nm. As such, the bottom surface of the cylinder hole is exposed to the top surface of conductive plug 221.

Figure 15C:
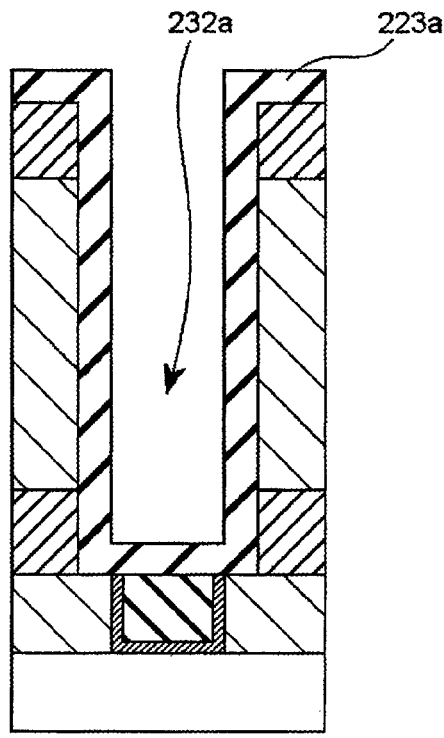

Then, as shown in FIG. 15C, TiN film 223a, which is the material of the lower electrode of the capacitor, is formed on the entire surface including the inner surface of cylinder hole 232. The TiN film can be formed by a CVD method with source gases of $TiCl_4$ and $NH_3$ at a forming temperature between 380° C. to 650° C. The forming temperature is 450° C. and the film thickness is 10 nm in this embodiment. Alternatively, the TiN film can also be formed by an ALD method using the same source gases. The formation of TiN film 223a defines new cylinder hole 232a.

Figure 15D:
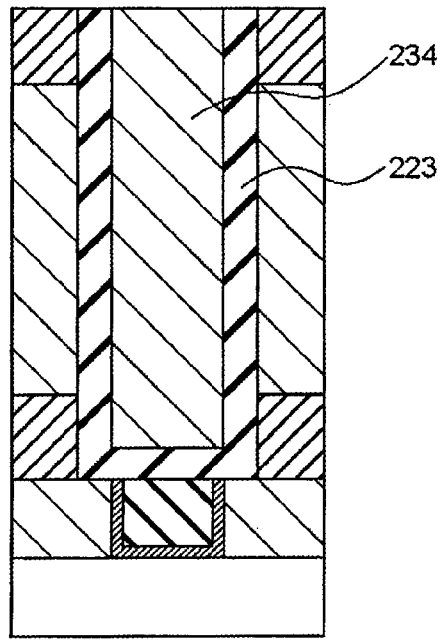

Then, as shown in FIG. 15D, protective film 234 such as a silicon oxide film is formed on the entire surface to load cylinder hole 232a. Then, TiN film 223a and the protective film 234 formed on the top surface of the support film 222c are removed by a CMP or dry etching method to form lower electrode 223.

Figure 15E:
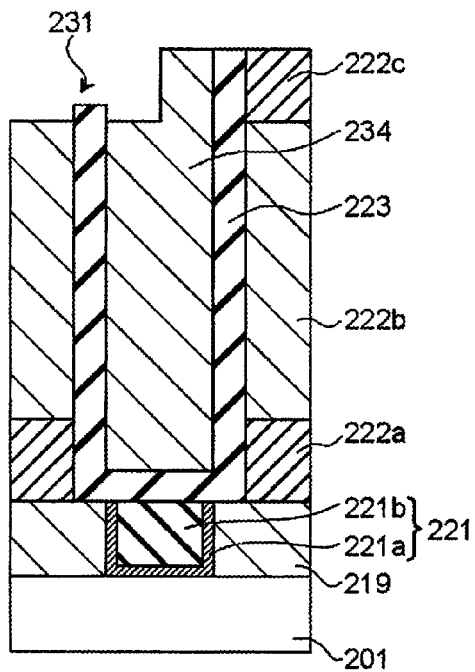

Then, opening 231 is formed in support film 222c (see FIG. 15E). As illustrated in the plane view of FIG. 14, the pattern of opening 231 overlaps with a part of fourth interlayer insulation film 222b, a part of lower electrode 223, and a part of protective film 234 remaining in the inside of the lower electrode. Therefore, dry-etching for forming opening 231 removes a portion of the top of lower electrode 223 and the protective film 234 as well as the support film 222c formed on fourth interlayer insulation film 222b.

Figure 15F:
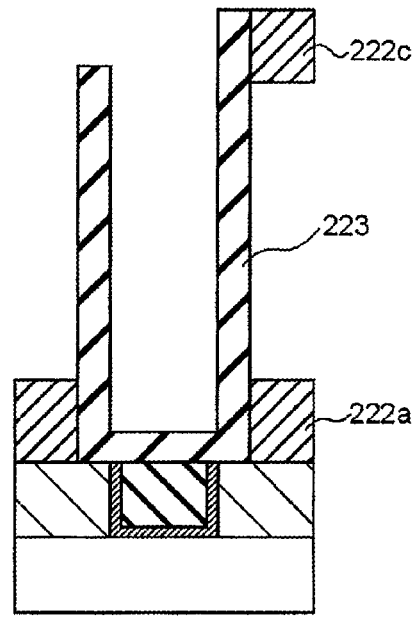

Then, as shown in FIG. 15F, fourth interlayer insulation film 222b exposed in opening 231 is removed. For example, an etching process using hydrofluoric acid solution (HF solution) does not substantially etch support film 222c because support film 222c is made of a silicon nitride film, but removes all of protective film 234 and fourth interlayer insulation film 222b formed with a silicon oxide film.

Besides the area right under opening 231, the silicon oxide film below support film 222c is also removed because the etching uses a solution. Accordingly, lower electrode 223 and support film 222c supporting lower electrode 223 remains hollow, and lower electrode 223 exposes its surface.

During this etching process, third interlayer insulation film 222a made of a silicon nitride film functions as an etching stopper, preventing second interlayer insulation film 219 from being etched.

Figure 15G:
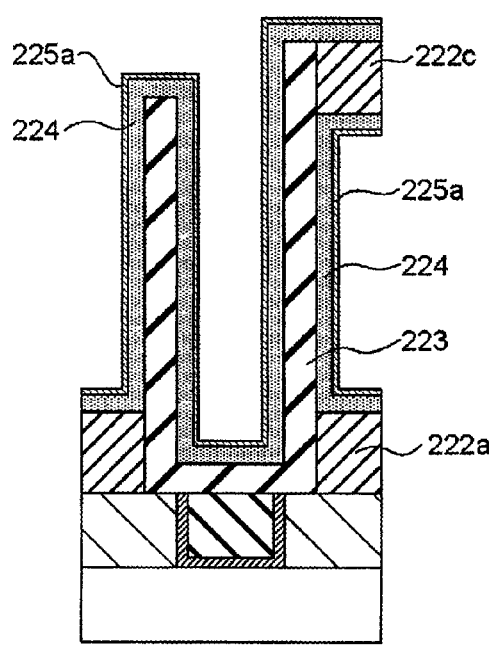

Then, as shown in FIG. 15G, dielectric film 224 and first protective film 225a are formed. First protective film 225a and dielectric film 224 have a TZAZ structure described in Experiment 5 or a TZAZT structure into which the second protective film is introduced as described in Experiment 6 is introduce. These films can be formed by an ALD method. These TZAZ and TZAZT structures are optimized to achieve a desired feature for each parameter. A film formed by an ALD method has an excellent step coverage, and thus dielectric film 224 and first protective film 225a are formed on the entire surface of the lower electrode exposed as being hollow. As defined above, 'ZAZ' in TZAZ or TZAZT indicates a dielectric film having zirconium oxide as a primary constituent and containing aluminum oxide within the dielectric film. 'T' is a protective film having as a primary constituent a titanium compound, in particular titanium oxide (or titanium nitride formed at a low temperature for the upper located 'T').

Figure 15H:
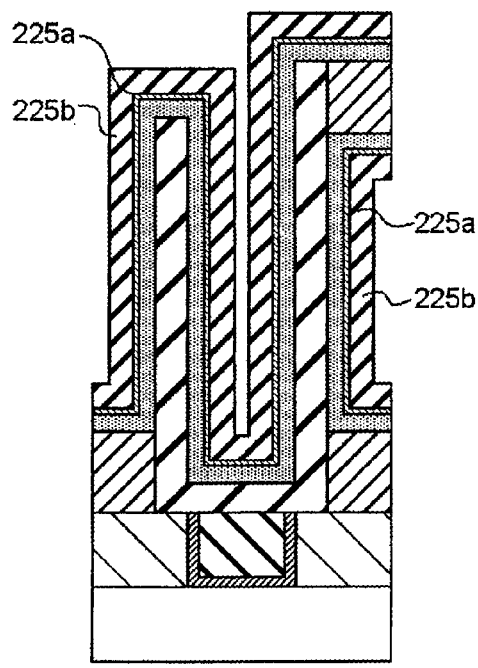

Then, as shown in FIG. 15H, a TiN film is formed as upper electrode 225b. Like the lower electrode, upper electrode 225b is formed by a CVD method at 450° C. with source gases of $TiCl_4$ and $NH_3$. The film thickness is 10 nm. Because a TiN film formed by a CVD method has very excellent step coverage, the film can approach the hollow space so that it may be formed on the entire surface of first protective film 225a.

Because dielectric film 224 is heat-treated under the protection of a TiO or TiN film, which is first protective film 225a, although upper electrode 225b is formed at 450° C., damages such as oxygen deficiency, peeling-off, or crack on dielectric film 224 can be prohibited as explained in the previous experiments, and the problem of an increase in leakage current can be avoided.

Figure 15I:
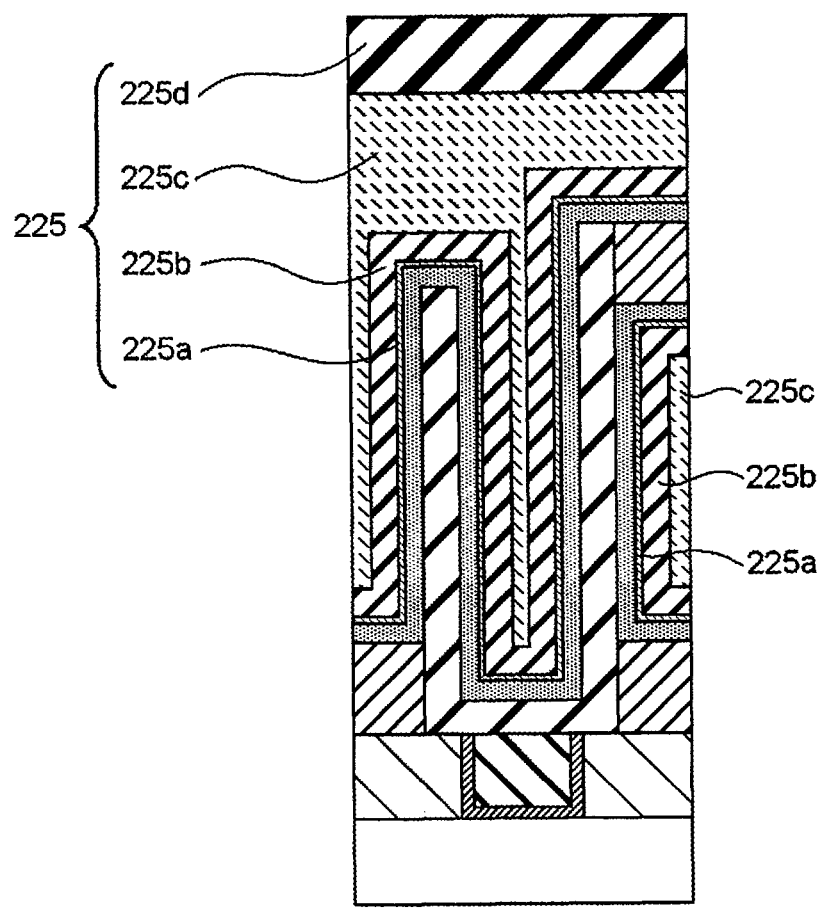

Then, as shown in FIG. 15I, a boron-doped silicon germanium film (B—SiGe film) is formed as second upper electrode 225c. At the stage of forming upper electrode 225b in FIG. 15H, a hollow state partially remains to leave spaces all around. If tungsten which is to be a plate is formed by a PVD method under this circumstance, spaces would remain around the capacitor even at the final stage of fabricating a semiconductor device because the spaces may not be all filled due to the inferior step coverage of the PVD method. These remaining spaces worsens the mechanical strength, and causes a change in the characteristic of the capacitor due to the stress occurred during the packaging of the subsequent processes. Therefore, the object of forming the B—SiGe film is to stuff, and thus eliminate, the remaining spaces and to improve resistance to mechanical stress.

The B—SiGe film can be formed by a CVD method with source gases of germane ($GeH_4$), silane ($SiH_4$) and boron trichloride ($BCl_3$). The B—SiGe film formed by this method has an excellent step coverage, which allows stuffing the hollow spaces. The CVD method requires 420° C. to 500° C. at a forming temperature and performs heat treatment for six hours to the capacitor when it is formed in a batch manner in consideration of productivity. The heat treatment in this process was represented by the nitrogen annealing at 450° C. for six hours in Experiments 5 and 6. Even if a heat treatment at a maximum temperature of 500° C. is performed during the process of forming a B—SiGe film for second upper electrode 225c, the capacitor according to the methods in Experiments 5 and 6 can have low leakage current.

After forming the B—SiGe film as second upper electrode 225c, a tungsten film (W film) is formed as third upper electrode 225d so as to be used as a power supply plate covering the entire memory cell area. Because the W film is formed by a PVD method at 25° C. to 300° C., it imposes no heat-related influence such as an increase in the dielectric film's leakage current. After that, as shown in FIG. 13, a semiconductor device including DRAM is fabricated by performing a process of forming fifth interlayer insulation film 226 and subsequent processes.

As described above, upper electrode 225 shown in FIG. 13 with the entire structure includes a polycrystalline TiO film (or TiN film) as first protective film 225a, a polycrystalline TiN film as upper electrode 225b, a B—SiGe film as second upper electrode, and a W film as third upper electrode 225d, as depicted in detail in FIG. 15I. When a TiN film is formed as first protective film 225a, it is not distinguished, being integrated with a polycrystalline TiN film which is to be upper electrode 225b. The structure and manufacturing method for a DRAM according to this exemplary embodiment are to fabricate a most-advanced, super integrated DRAM. The B—SiGe forming process is not necessary if a capacitor which does not require support film 222c for preventing collapse is used even if it has a three-dimensional structure.

In the DRAM formed in accordance to the embodiment, as described in Experiments 5 and 6, the deterioration in leakage current characteristic is dramatically improved compared to a known ZAZ structure even upon hydrogen-annealing performed for reducing the interface state of a transistor. Therefore, the transistor characteristic can be compatible with the capacitor characteristic in DRAM, and a device with high reliability and high yield rate can thus be fabricated.

For example, hydrogen annealing can be performed at 400° C. to 450° C. for 30 minutes to 5 hours under reducing atmosphere containing hydrogen gas. It is desirable to perform hydrogen annealing at least after forming the upper electrode, and more preferably after forming, for example, the wiring for the peripheral circuit area.

The prevent invention includes the following aspect of embodiment.

I. A semiconductor device comprising a capacitor, the capacitor comprising:
   a lower electrode comprising titanium nitride connected to a semiconductor substrate,
   a dielectric film comprising a layer of zirconium oxide as a primary constituent, the layer of zirconium oxide being in contact with said lower electrode and covering said lower electrode, and
   an upper electrode comprising a titanium nitride film, the titanium nitride film being in contact with said dielectric film and covering said dielectric film,
   wherein a protective film comprising titanium oxide as a primary constituent is inserted in either, or preferably both, of the interface between said upper electrode and said dielectric film and the interface between said lower electrode and said dielectric film.

II. The semiconductor device according to item I, wherein said protective film comprising titanium oxide as a primary constituent and being inserted in the interface between said upper electrode and said dielectric film is a titanium oxide film with a film thickness of 0.4 to 5 nm.

III. The semiconductor device according to item II, wherein said protective film comprising titanium oxide as a primary constituent and being inserted in the interface between said upper electrode and said dielectric film is a polycrystalline titanium oxide film with a film thickness of 1 to 5 nm and has conductivity.

IV. The semiconductor device according to items I to III, wherein said protective film comprising titanium oxide as a primary constituent and being inserted in the interface between said lower electrode and said dielectric film has a film thickness of not less than 0.4 nm and not more than 2 nm.

V. The semiconductor device according to items I to IV, wherein said dielectric film comprising zirconium oxide as a primary constituent has a portion of the dielectric film containing aluminum oxide.

VI. The semiconductor device according to item V, wherein said dielectric film comprising zirconium oxide as a primary constituent has a composite ratio of 0.8 or more, the composite ratio being indicated Z/(Z+M) where Z is the number of zirconium atoms and M is the number of aluminum atoms.

VII. The semiconductor device according to items I to VI, wherein said dielectric film comprising zirconium oxide as a primary constituent has a film thickness of 5 to 8 nm.

VIII. The semiconductor device according to items I to VI, wherein said dielectric film has a stacked structure of a first dielectric film made of a polycrystalline zirconium oxide film, a second dielectric film made of an amorphous aluminum oxide film on said first dielectric film, and a third dielectric film made of a polycrystalline zirconium oxide film on said second dielectric film, and
   wherein said protective film comprising titanium oxide is formed on said third dielectric film.

IX. The semiconductor device according to item VIII, wherein the film thickness of said first and third dielectric films in total falls within the range from 5 nm to 7 nm.

X. The semiconductor device according to items I to IX, wherein $SiO_2$ equivalent oxide thickness (EOT) of said dielectric film is 1.2 nm or less.

XI. The semiconductor device according to items I to X, wherein said lower electrode has a three-dimensional structure.

XII. The semiconductor device according to item XI, further comprising a second upper electrode made of a silicon germanium film containing boron on said titanium nitride film for the upper electrode.

XIII. The semiconductor device according to items I to XII, wherein said capacitor has the leakage current characteristic of a current density of $1E-7(A/cm^2)$ or less when a voltage within the range of ±2 V is applied, after being annealed at 400° C. to 450° C. under reducing atmosphere containing hydrogen gas after the formation of the capacitor.

What is claimed is:

1. A semiconductor device comprising a capacitor, the capacitor comprising:
   a lower electrode comprising titanium nitride connected to a semiconductor substrate,
   a dielectric film comprising a layer of zirconium oxide as a primary constituent, the dielectric film being formed on said lower electrode,
   an upper electrode comprising a titanium nitride film, the upper electrode being formed on said dielectric film, and
   a protective film comprising titanium oxide as a primary constituent and being inserted in at least one of the interface between said upper electrode and said dielectric film and the interface between said lower electrode and said dielectric film.

2. The semiconductor device according to claim 1, wherein said protective film is inserted in either of the interface between said upper electrode and said dielectric film and the interface between said lower electrode and said dielectric film.

3. The semiconductor device according to claim 1, wherein said protective film is inserted in both of the interface between said upper electrode and said dielectric film and the interface between said lower electrode and said dielectric film.

4. The semiconductor device according to claim 1, wherein said protective film being inserted in the interface between said upper electrode and said dielectric film is a titanium oxide film with a film thickness of 0.4 to 5 nm.

5. The semiconductor device according to claim 4, wherein said protective film being inserted in the interface between said upper electrode and said dielectric film is a polycrystalline titanium oxide film with a film thickness of 1 to 5 nm and has conductivity.

6. The semiconductor device according to claim 1, wherein said protective film being inserted in the interface between said lower electrode and said dielectric film has a film thickness of not less than 0.4 nm and not more than 2 nm.

7. The semiconductor device according to claim 1, wherein said dielectric film has a portion of the dielectric film containing aluminum oxide.

8. The semiconductor device according to claim 7, wherein said dielectric film comprising zirconium oxide as a primary constituent has a composite ratio of 0.8 or more, the composite ratio being indicated Z/(Z+M) where Z is the number of zirconium atoms and M is the number of aluminum atoms.

9. The semiconductor device according to claim 1, wherein said dielectric film comprising zirconium oxide as a primary constituent has a film thickness of 5 to 8 nm.

10. The semiconductor device according to claim 1, wherein said dielectric film has a stacked structure of a first dielectric film made of a polycrystalline zirconium oxide film, a second dielectric film made of an amorphous aluminum oxide film on said first dielectric film, and a third dielectric film made of a polycrystalline zirconium oxide film on said second dielectric film, and wherein said protective film comprising titanium oxide is formed on said third dielectric film.

11. The semiconductor device according to claim 8, wherein the film thickness of said first and third dielectric films in total falls within the range from 5 nm to 7 nm.

12. The semiconductor device according to claim 1, wherein $SiO_2$ equivalent oxide thickness (EOT) of said dielectric film is 1.2 nm or less.

13. The semiconductor device according to claim 1, wherein said lower electrode has a three-dimensional structure.

14. The semiconductor device according to claim 13, further comprising a second upper electrode made of a silicon germanium film containing boron on said titanium nitride film for the upper electrode.

15. The semiconductor device according to claim 1, wherein said capacitor has the leakage current characteristic of a current density of $1E-7(A/cm^2)$ or less when a voltage within the range of ±2 V is applied, after being annealed at 400° C. to 450° C. under reducing atmosphere containing hydrogen gas after the formation of the capacitor.

* * * * *